(12) United States Patent
Nam et al.

(10) Patent No.: US 9,076,683 B2
(45) Date of Patent: Jul. 7, 2015

(54) OPERATING METHOD OF NONVOLATILE MEMORY AND METHOD OF CONTROLLING NONVOLATILE MEMORY

(75) Inventors: Sang-Wan Nam, Hwaseong-Si (KR);
Kang-Bin Lee, Suwon-Si (KR);
Junghoon Park, Hwaseong-Si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 218 days.

(21) Appl. No.: 13/587,955

(22) Filed: Aug. 17, 2012

(65) Prior Publication Data

US 2013/0088921 A1    Apr. 11, 2013

(30) Foreign Application Priority Data

Oct. 6, 2011    (KR) ........................ 10-2011-0102015

(51) Int. Cl.
*G11C 16/04*  (2006.01)
*H01L 27/115*  (2006.01)
*G11C 16/34*  (2006.01)

(52) U.S. Cl.
CPC ........ *H01L 27/1157* (2013.01); *G11C 16/0483* (2013.01); *G11C 16/3459* (2013.01); *H01L 27/11582* (2013.01)

(58) Field of Classification Search
USPC .............. 365/185.17, 185.02, 185.28
See application file for complete search history.

(56) References Cited

U.S. PATENT DOCUMENTS

| | | | | |
|---|---|---|---|---|
| 6,614,070 | B1 * | 9/2003 | Hirose et al. | 257/316 |
| 7,120,063 | B1 * | 10/2006 | Liu et al. | 365/185.24 |
| 7,170,785 | B2 * | 1/2007 | Yeh | 365/185.17 |
| 7,203,092 | B2 * | 4/2007 | Nazarian | 365/185.17 |
| 7,342,831 | B2 | 3/2008 | Mokhlesi et al. | |
| 7,547,941 | B2 * | 6/2009 | Chen | 257/320 |
| 7,933,151 | B2 | 4/2011 | Maeda et al. | |
| 8,107,286 | B2 * | 1/2012 | Itagaki et al. | 365/185.02 |
| 8,120,960 | B2 * | 2/2012 | Varkony | 365/185.16 |
| 8,305,810 | B2 * | 11/2012 | Aritome | 365/185.17 |
| 8,335,108 | B2 * | 12/2012 | Lee et al. | 365/185.17 |
| 8,947,933 | B2 * | 2/2015 | Tokiwa et al. | 365/185.11 |

FOREIGN PATENT DOCUMENTS

KR    1020060120889 A    11/2006
KR    1020110037340 A    4/2011

* cited by examiner

*Primary Examiner* — Pho M Luu
(74) *Attorney, Agent, or Firm* — Volentine & Whitt, PLLC

(57) ABSTRACT

An operating method of a nonvolatile memory, which includes a plurality of cell strings, each cell string having a plurality of memory cells and a string selection transistor stacked on a substrate, includes detecting threshold voltages of the string selection transistors of the plurality of cell strings; adjusting voltages to be supplied to the string selection transistors according to the detected threshold voltages; and applying the adjusted voltages to the string selection transistors to select or unselect the plurality of cell strings during a programming operation.

20 Claims, 16 Drawing Sheets

OPERATING METHOD OF NONVOLATILE MEMORY AND METHOD OF CONTROLLING NONVOLATILE MEMORY

CROSS-REFERENCE TO RELATED APPLICATIONS

A claim for priority under 35 U.S.C §119 is made to Korean Patent Application No. 10-2011-0102015 filed Oct. 6, 2011, the entirety of which is incorporated by reference herein.

BACKGROUND

The inventive concepts described herein relate to a semiconductor memory device, and more particularly, relate to a memory system including a nonvolatile memory device.

A semiconductor memory device may be a memory device which is fabricated using semiconductors such as silicon (Si), germanium (Ge), gallium arsenide (GaAs), indium phosphide (InP), and the like. Semiconductor memory devices may be classified into volatile memory devices and nonvolatile memory devices.

The volatile memory devices may lose stored contents at power-off. The volatile memory devices may include a Static RAM (SRAM), a Dynamic RAM (DRAM), a Synchronous DRAM (SDRAM), and the like. The nonvolatile memory devices may retain stored contents even at power-off. The nonvolatile memory devices may include a Read Only Memory (ROM), a Programmable ROM (PROM), an Electrically Programmable ROM (EPROM), an Electrically Erasable and Programmable ROM (EEPROM), a flash memory device, a Phase-change RAM (PRAM), a Magnetic RAM (MRAM), a Resistive RAM (RRAM), a Ferroelectric RAM (FRAM), and the like. The flash memory device may be roughly divided into a NOR type and a NAND type.

Recently, a semiconductor memory device with a three-dimensional array structure has been developed to improve the integrity of the semiconductor memory device.

SUMMARY

One aspect of embodiments of the inventive concept is directed to providing an operating method of a nonvolatile memory which includes a plurality of cell strings, each cell string having a plurality of memory cells and a string selection transistor stacked on a substrate. The operating method comprises detecting threshold voltages of the string selection transistors of the plurality of cell strings; adjusting voltages to be supplied to the string selection transistors according to the detected threshold voltages; and applying the adjusted voltages to the string selection transistors to select or unselect the plurality of cell strings during a programming operation.

In one embodiment, gates of the string selection transistors are connected to string selection lines, and adjusting voltages to be supplied to the string selection transistors comprises adjusting voltages to be supplied to the string selection lines.

In one embodiment, adjusting voltages to be supplied to the string selection transistors comprises adjusting voltages to be supplied to the string selection lines when at least one of the detected threshold voltages lies outside of a threshold voltage distribution between a first comparison voltage and a second comparison voltage.

In one embodiment, the first comparison voltage is less than the second comparison voltage; and adjusting voltages to be supplied to the string selection lines comprises, when the detected threshold voltages are between the first comparison voltage and the second comparison voltage, adjusting voltages to be supplied to the string selection lines to have a first voltage; when at least one of the detected threshold voltage is less than the first comparison voltage, adjusting voltages to be supplied to the string selection lines to have a second voltage less than the first voltage; and when at least one of the detected threshold voltage is greater than the second comparison voltage, adjusting voltages to be supplied to the string selection lines to have a third voltage greater than the first voltage.

In one embodiment, the string selection transistors connect bit lines and the plurality of cell strings, respectively; and adjusting voltages to be supplied to the string selection transistors comprises adjusting voltages to be supplied to the bit lines.

In one embodiment, adjusting voltages to be supplied to the bit lines comprises adjusting voltages to be supplied to the bit lines when at least one of the detected threshold voltage gets out of a threshold voltage distribution between a first comparison voltage and a second comparison voltage.

In one embodiment, the first comparison voltage is less than the second comparison voltage; and adjusting voltages to be supplied to the bit lines comprises when the detected threshold voltages are between the first comparison voltage and the second comparison voltage, adjusting voltages to be supplied to the bit lines to have a first voltage; when at least one of the detected threshold voltage is less than the first comparison voltage, adjusting voltages to be supplied to the bit lines to have a second voltage greater than the first voltage; and when at least one of the detected threshold voltage is greater than the second comparison voltage, adjusting voltages to be supplied to the bit lines to have a third voltage less than the first voltage.

In one embodiment, detecting threshold voltages of the string selection transistors comprises ascertaining threshold voltages of the selection transistors by performing a read operation on the string selection transistors using at least one read voltage.

In one embodiment, the plurality of cell strings further comprises ground selection transistors connecting the substrate and the plurality of cell strings, and the operating method further comprises detecting threshold voltages of the ground selection transistors; adjusting voltages to be supplied to the ground selection transistors according to the detected threshold voltages of the ground selection transistors; and applying the adjusted voltages to the ground selection transistors during the programming operation.

In one embodiment, gates of the ground selection transistors are connected to ground selection lines, and adjusting voltages to be supplied to the ground selection transistors comprises adjusting voltages to be supplied to the ground selection lines.

In one embodiment, adjusting voltages to be supplied to the ground selection transistors comprises adjusting voltages to be supplied to the ground selection lines when at least one of the detected threshold voltages lies outside of a threshold voltage distribution between a first comparison voltage and a second comparison voltage.

In one embodiment, the first comparison voltage is lower than the second comparison voltage; and adjusting voltages to be supplied to the string selection lines comprises when the detected threshold voltages are between the first comparison voltage and the second comparison voltage, adjusting voltages to be supplied to the ground selection lines to have a first voltage; when at least one of the detected threshold voltage is less than the first comparison voltage, adjusting voltages to be supplied to the ground selection lines to have a second voltage less than the first voltage; and when at least one of the detected threshold voltage is greater than the second comparison voltage, adjusting voltages to be supplied to the ground selection lines to have a third voltage greater than the first voltage.

Another aspect of embodiments of the inventive concept is directed to providing a method of controlling a nonvolatile memory which includes a plurality of cell strings, each cell string having a plurality of memory cells stacked on a substrate and a string selection transistor selecting the plurality of memory cells. The method comprises generating a status read control signal; receiving information on threshold voltages of the string selection transistors provided from the nonvolatile memory according to the status read control signal; and controlling the nonvolatile memory such that voltages to be supplied to the string selection transistors are adjusted during a programming operation, according to the information on the threshold voltages.

In one embodiment, the method further comprises storing the information on the threshold voltages, and wherein controlling the nonvolatile memory comprises controlling the nonvolatile memory according to the information on the stored threshold voltages.

In one embodiment, the plurality of cell strings further comprises ground selection transistors connecting the substrate and the plurality of cell strings, and the method further comprises generating a second status read control signal; receiving information on threshold voltages of the ground selection transistors provided from the nonvolatile memory according to the second status read control signal; and controlling the nonvolatile memory such that voltages to be supplied to the ground selection transistors are adjusted during the programming operation, according to the information on the threshold voltages of the ground selection transistors.

Another aspect of embodiments of the inventive concept is directed to a method which includes providing a nonvolatile memory which includes a plurality of cell strings, each cell string having a corresponding plurality of memory cells and a corresponding string selection transistor stacked on a substrate, wherein the string selection transistors are connected to string selection lines and wherein each string selection transistor has a corresponding threshold voltage. The method further includes ascertaining whether the threshold voltage of any of the string selection transistors lies outside of a specified threshold voltage range; and when the threshold voltages of the string selection transistors are ascertained to lie within the specified threshold voltage range, applying a first voltage to a first terminal of a selected string selection line and applying a second voltage to unselected string selection lines during a programming operation of the nonvolatile memory; and when a first threshold voltage of at least a first one of the string selection transistors is ascertained to lie outside of the specified threshold voltage range, applying a third voltage different from the first voltage and the second voltage to a first string selection line connected to the first string selection transistor during the programming operation of the nonvolatile memory.

In one embodiment, when the first string selection line is the selected string selection line and the first threshold voltage is greater than the specified threshold voltage range, then the third voltage is greater than the first voltage.

In one embodiment, when the first string selection line is one of the unselected string selection lines and the first threshold voltage is less than the specified threshold voltage range, then the third voltage is less than the second voltage.

In one embodiment, ascertaining whether the threshold voltage of any of the string selection transistors lies outside of a specified threshold voltage range comprises: detecting the threshold voltages of the string selection transistors; and storing the detected threshold voltages in a status register.

In one embodiment, the string selection transistors connect the cell strings to bit lines, and the method further comprises: when the first threshold voltage of the first string selection transistor is ascertained to lie outside of the specified threshold voltage range, adjusting a voltage applied to the bit line during the programming operation.

BRIEF DESCRIPTION OF THE FIGURES

The above and other objects and features will become apparent from the following description with reference to the following figures, wherein like reference numerals refer to like parts throughout the various figures unless otherwise specified

DETAILED DESCRIPTION

Figure 1:
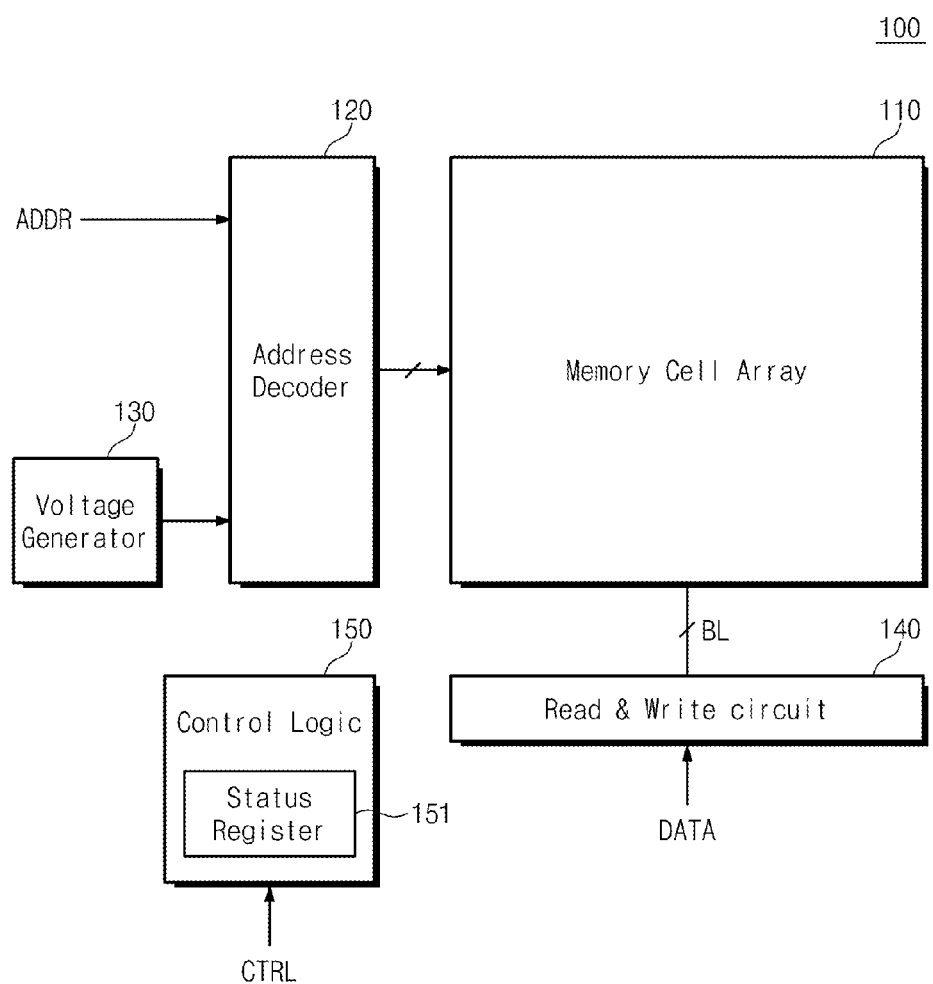
FIG. 1 is a block diagram schematically illustrating a nonvolatile memory according to an embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory according to an embodiment of the inventive concept. Referring to FIG. 1, a nonvolatile memory 100 may include a memory cell array 110, an address decoder 120, a voltage generator 130, a read and write circuit 140, and control logic 150.

Memory cell array 110 may be connected to address decoder 120. Memory cell array 110 may be connected to read and write circuit 140 via bit lines BL. Memory cell array 110 may include a plurality of cell strings, each of which includes a ground selection transistor GST (refer to FIG. 6), a plurality of memory cells MC (refer to FIG. 6), and a string selection transistor SST (refer to FIG. 6) stacked on a substrate. Each of the memory cells may store one or more bits of data.

Address decoder 120 may be connected to memory cell array 110 via string selection lines SSL, word lines WL (refer to FIG. 6), and ground selection lines GSL. Address decoder 120 may be connected to voltage generator 130. Address decoder 120 may operate responsive to the control of control logic 150. Address decoder 120 may drive the string selection lines SSL, the word lines WL, and the ground selection lines GSL based on voltages, generated from voltage generator 130, and a power supply voltage and a ground voltage supplied to nonvolatile memory device 100.

Address decoder 120 may receive an address ADDR from an external device.

Address decoder 120 may be configured to decode a block address of the input address ADDR. Address decoder 120 may select one of the memory blocks of memory cell array 110 based on the decoded block address. In an embodiment, address decoder 120 may control voltages of the ground selection lines according to the decoded block address.

Address decoder 120 may decode a row address of the input address ADDR. Address decoder 120 may select a plurality of cell strings corresponding to the input address ADDR by applying voltages to the string selection lines according to the decoded row address.

Address decoder 120 may select a word line corresponding to the decoded row address. Address decoder 120 may select a word line corresponding to the input address ADDR by applying voltages, provided from voltage generator 130, to the word lines according to the decoded row address.

In an embodiment, when address decoder 120 is further connected to memory cell array 110 via dummy word lines, it may control voltages applied to the dummy word lines according to the decoded row address.

Address decoder 120 may decode a column address of the input address ADDR. Address decoder 120 may provide the decoded column address to read and write circuit 140.

In an embodiment, address decoder 120 may include a row decoder decoding a row address, a column decoder decoding a column address, and an address buffer storing an address ADDR.

Voltage generator 130 may be connected to address decoder 120. Voltage generator 130 may be configured to generate a high voltage. For example, voltages generated by voltage generator 130 may be transferred to the plurality of lines connected to memory cell array 110 via address decoder 120.

Read and write circuit 140 may be connected to memory cell array 110 via the bit lines BL. Read and write circuit 140 may operate responsive to the control of control logic 150. Read and write circuit 140 may receive the decoded column address from address decoder 120. Read and write circuit 140 may select the bit lines BL using the decoded column address.

In an embodiment, during a programming operation, read and write circuit 140 may program data provided from the outside in memory cell array 110. During a read operation, read and write circuit 140 may read data from memory cell array 110 to transfer it to the outside. Read and write circuit 140 may read data from a first storage region of memory cell array 110 to write it in a second storage region of memory cell array 110. For example, read and write circuit 140 may perform a copy-back operation.

In an embodiment, read and write circuit 140 may include constituent elements such as a page buffer (or, a page register), a column selector, and the like. In another embodiment, read and write circuit 140 may include constituent elements such as a sense amplifier, a write driver, a column selector, and the like.

In an embodiment, although not shown in FIG. 1, nonvolatile memory 100 may further comprise a constituent element such as a buffer circuit. In this case, the buffer circuit may receive program data from the outside during a programming operation, and may transfer read data to the outside during a read operation. Read and write circuit 140 may receive data from the buffer circuit during a programming operation, and may transfer data read from memory cell array 110 to the buffer circuit.

Control logic 150 may be connected to address decoder 120, voltage generator 130, and read and write circuit 140. Control logic 150 may be configured to control an overall operation of nonvolatile memory 100. Control logic 150 may operate responsive to a control signal CTRL from the outside.

Control logic 150 may include a status register 151. Status register 151 may store information associated with threshold voltages of string selection transistors of memory cell array 110. Status register 151 may store information associated with threshold voltages of ground selection transistors of memory cell array 110.

For example, control logic 150 may sense threshold voltages of the string selection transistors via a plurality of read operations to store a sensing result in status register 151. Further, control logic 150 may sense threshold voltages of the ground selection transistors via a plurality of read operations to store a sensing result in status register 151. This will be more fully described with reference to FIG. 11.

Before a programming operation, control logic 150 may adjust voltages to be applied to the string and ground selection transistors based on information stored in status register 151. Before a programming operation is executed, control logic 150 may control voltage generator 130 according to the information stored in status register 151 such that voltages generated from voltage generator 130 are adjusted.

The inventive concept may be implemented such that threshold voltages of string selection transistors are sensed and voltages to be applied to the string selection transistors are adjusted. This may make it possible to reduce a leakage current flowing from cell strings via string selection transistors. Further, the inventive concept may be implemented such that threshold voltages of ground selection transistors are sensed and voltages to be applied to the ground selection transistors are adjusted. This may make it possible to reduce a leakage current flowing from cell strings via ground selection transistors. Thus, it is possible to provide nonvolatile memory 100 with improved reliability.

Figure 2:
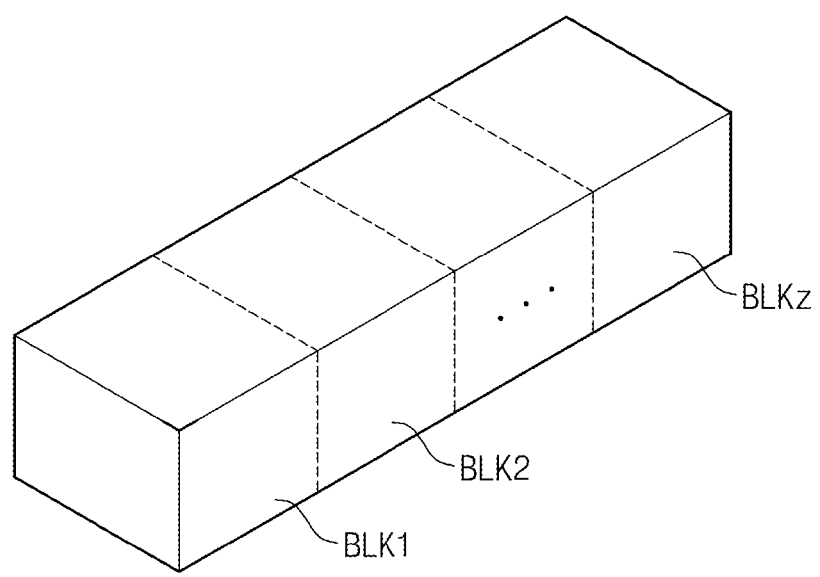
FIG. 2 is a block diagram illustrating an embodiment of the memory cell array in FIG. 1.

FIG. 2 is a block diagram illustrating a memory cell array in FIG. 1. Referring to FIG. 2, a memory cell array 110 may include a plurality of memory blocks BLK1 to BLKz. Each of the memory blocks BLK1 to BLKz may be formed to have a three-dimensional structure (or a vertical structure). For example, each of the memory blocks BLK1 to BLKz may include structures extending along first to third directions. Each of the memory blocks BLK1 to BLKz may include a plurality of cell strings extending along a second direction. A plurality of cell strings may be provided to be arranged along the first and third directions. Each of the memory blocks BLK1 to BLKz may be connected with a plurality of bit lines BL, a plurality of string selection lines SSL, a ground selection line GSL, a plurality of word lines WL, and a common source line CSL. The memory blocks BLK1 to BLKz will be more fully described with reference to FIG. 3.

In an exemplary embodiment, the memory blocks BLK1 to BLKz may be selected by an address decoder 120 in FIG. 1. For example, address decoder 120 may be configured to select a memory block BLKi (i=1 to z) corresponding to a decoded block address from among the memory blocks BLK1 to BLKz.

Figure 3:
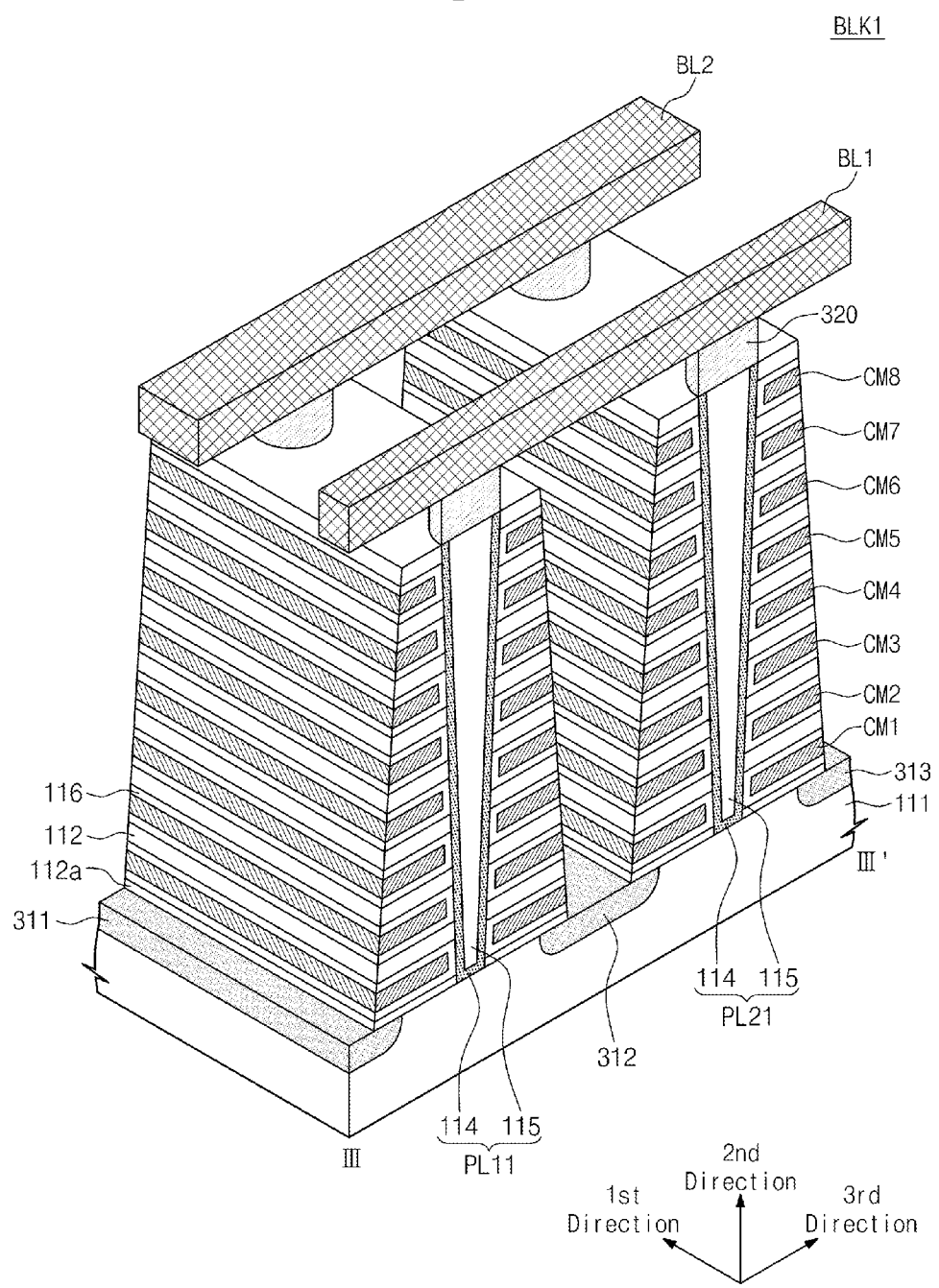
FIG. 3 is a perspective view of one of the memory blocks in FIG. 2.
Figure 4:
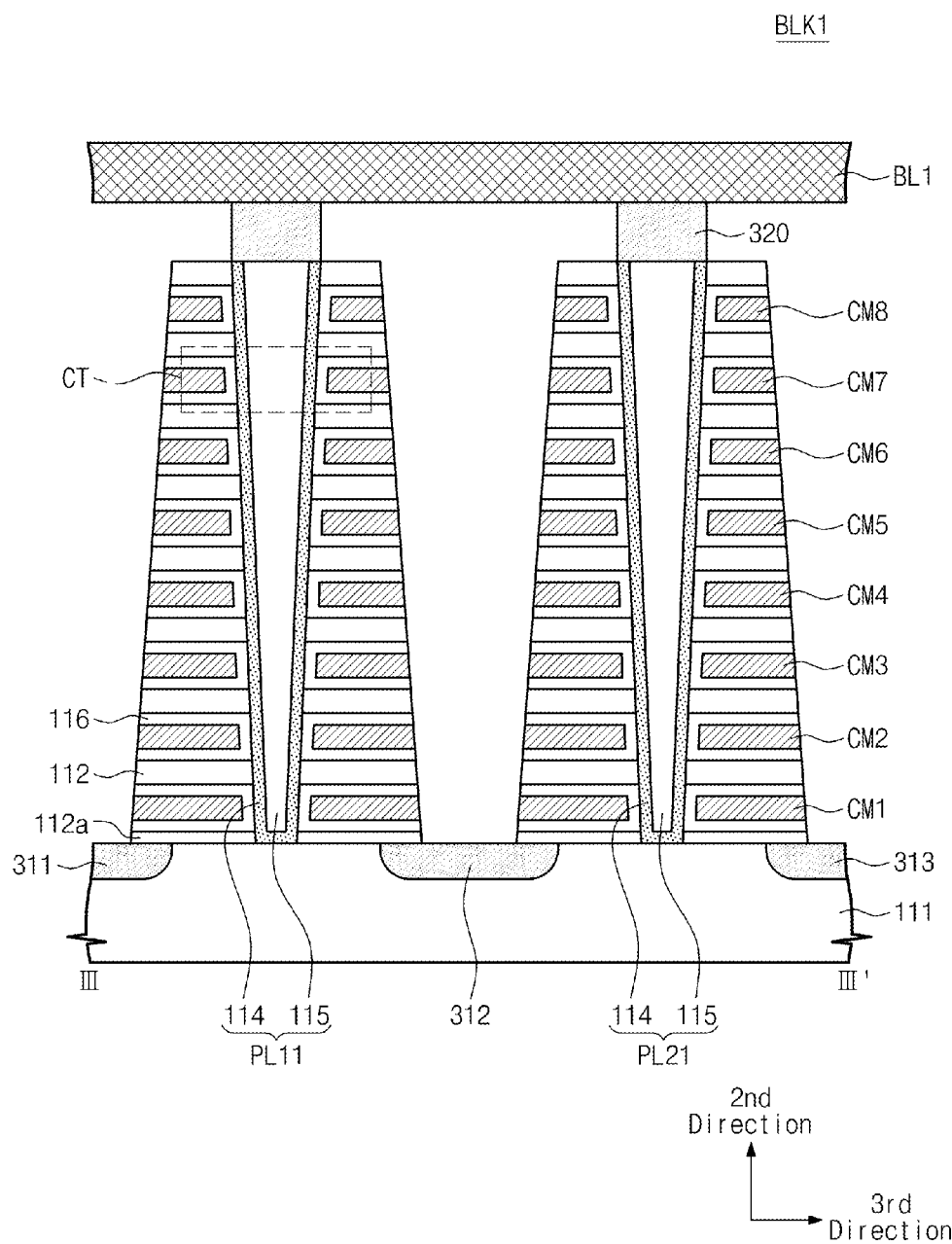
FIG. 4 is a cross-sectional view taken along a line III-III' in FIG. 3.

FIG. 3 is a perspective view of one of memory blocks in FIG. 2. FIG. 4 is a cross-sectional view taken along a line III-III' in FIG. 3.

A substrate 111 may be provided. Substrate 111 may be a well having a first conductive type, for example. Substrate 111 may be a p-well in which a Group III element such as boron is injected. Substrate 111 may be a pocket p-well which is provided within an n-well. Below, it is assumed that substrate 111 is a p-well (or, a pocket p-well). However, substrate 111 is not limited to a p-type.

A plurality of doping regions 311 to 313 extending along a first direction may be provided in substrate 111. Doping regions 311 to 313 may be spaced apart from one another along the third direction. Doping regions 311 to 313 illustrated in FIGS. 3 and 4 may be referred to as to a first doping region 311, a second doping region 312, and a third doping region 313, respectively.

First to third doping regions 311 to 313 may have a second conductive type different from that of substrate 111. Below, it is assumed that first to third doping regions 311 to 313 are the n-type. However, first to third doping regions 311 to 313 are not limited to the n-type.

Between two adjacent doping regions of first to third doping regions 311 to 313, a plurality of insulation materials 112 and 112a may be provided on substrate 111 sequentially along the second direction (i.e., a direction perpendicular to substrate 111). Insulation materials 112 and 112a may be spaced apart along the second direction. Insulation materials 112 and 112a may extend along the first direction. For example, insulation materials 112 and 112a may include an insulation material such as a silicon oxide film. A thickness of insulation material 112a contacting with substrate 111 may be thinner than that of insulation material 112.

Between two adjacent doping regions of first to third doping regions 311 to 313, a plurality of pillars PL11, PL12, PL21, and PL22 may be arranged sequentially along the first direction so as to penetrate the plurality of insulation materials 112 and 112a along the second direction.

In an embodiment, a plurality of holes may be formed to penetrate the plurality of insulation materials 112 and 112a. Channel films 115 may be provided on the plurality of holes. For example, channel films 114 may include a semiconductor material (e.g., silicon) having the same type as substrate 111. Below, it is assumed that channel films 114 include p-type silicon. However, channel films 114 are not limited to the p-type silicon. For example, channel films 114 can include intrinsic semiconductor being a nonconductor.

Figure 6:
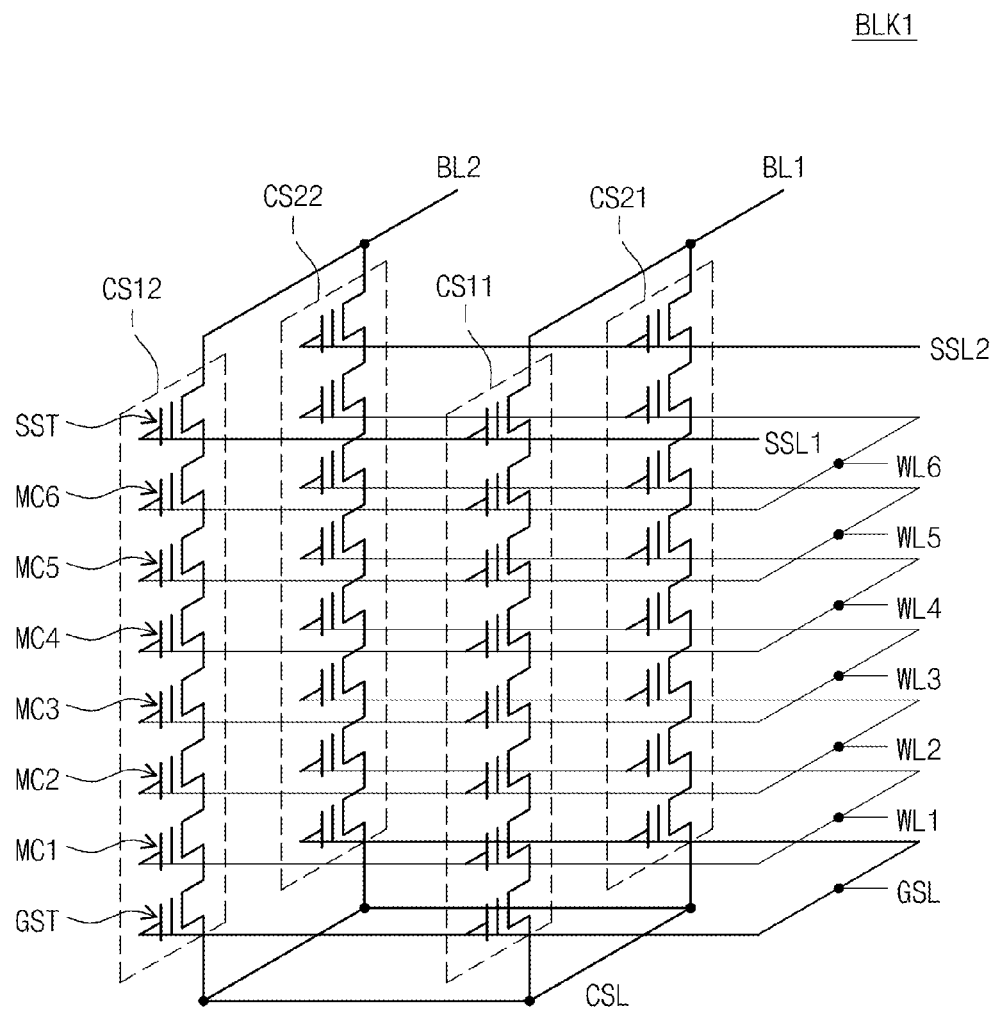
FIG. 6 is a circuit diagram illustrating an equivalent circuit of a memory block.

In an embodiment, before inner materials 115 are provided, regions, adjacent to first conductive materials CM8, of channel films 114 may be doped to adjust threshold voltages of string selection transistors SST (refer to FIG. 6). At this time, a process error may be generated. From example, since the width between channel films of each pillar is relatively narrow, a doping direction may be a direction intersecting with substrate 111 (e.g., a direction opposite to the second direction), not a direction perpendicular to the channel film. This may force a position of a projection range being a doping range to be varied or a doping concentration to be varied. The threshold voltage distribution of the string selection transistors SST may widen due to this process error.

After channel films 114 are provided, inner materials 115 may be provided. Inner materials 115 may include an insulation material. For example, inner materials 115 may include an insulation material such as silicon oxide. Alternatively, inner materials 115 may include air gap.

For example, the pillars PL11, PL12, PL21, and PL22 may contact with substrate 111 through insulation materials 112 and 112a. A width of each of the pillars PL11, PL12, PL21, and PL22 may vary in proportion to a distance from substrate 111. For example, the width of each of the pillars PL11, PL12, PL21, and PL22 may progressively decrease as the pillar gets closer to substrate 111.

Between two adjacent doping regions of first to third doping regions 311 to 313, information storage films 116 may be provided on exposed surfaces of insulation materials 112 and 112a and the pillars PL11, PL12, PL21, and PL22.

Between two adjacent doping regions of first to third doping regions 311 to 313, conductive materials CM1 to CM8 may be provided between information storage films 116. The conductive materials CM1 to CM8 may include a metallic conductive material. The conductive materials CM1 to CM8 can include a nonmetallic conductive material such as polysilicon.

A plurality of drains 320 may be provided on the plurality of pillars PL11, PL12, PL21, and PL22, respectively. Drains 320 may include a semiconductor material (e.g., silicon) having the second conductive type, for example. Drains 320 may include an n-type semiconductor material (e.g., silicon). Below, it is assumed that drains 320 include n-type silicon. However, the prevent invention is not limited thereto.

Bit lines BL1 and BL2 extending in the third direction may be provided on drains 320 so as to be spaced apart from one another in the first direction (i.e., there is a distance in the first direction between the bit lines BL1 and BL2). The bit lines BL1 and BL2 may be coupled with drains 320. In an embodiment, drains 320 and the bit lines BL1 and BL2 may be connected via contact plugs (not shown). The bit lines BL1 and BL2 may include a metallic conductive material. Alternatively, the bit lines BL1 and BL2 may include a nonmetallic conductive material such as polysilicon.

Below, rows and columns of the pillars PL11, PL12, PL21, and PL22 of a memory block BLK1 will be defined. Pillars PL11 and PL12 coupled with conductive materials CM1 to CM8 between first doping region 311 and second doping region 312 via information storage films 116 may be defined as the first row of pillars. Pillars PL21 and PL22 coupled with conductive materials CM1 to CM8 between second doping region 312 and third doping region 313 via information storage films 116 may be defined as the second row of pillars. That is, a row direction means the first direction. Columns of pillars PL11, PL12, PL21, and PL22 may be defined according to the bit lines BL1 and BL2. Pillars PL11 and PL21 connected with the bit line BL1 via the drains 320 may be defined as the first column of semiconductor pillars. Pillars PL12 and PL22 connected with the bit line BL2 via drains 320 may be defined as the second column of pillars. That is, a column direction means the third direction.

Below, heights of the conductive materials CM1 to CM8 may be defined. The conductive materials CM1 to CM8 may have first to eighth heights according to a distance from substrate 111. The conductive material CM1 closest to substrate 111 may have the first height, and the conductive material CM8 closest to the bit lines BL1 and BL2 may have the eighth height.

Each of the pillars PL11, PL12, PL21, and PL22 may constitute a cell string with an adjacent information storage film 116 and an adjacent conductive material CMj (j=1 to 8). That is, the pillars PL11, PL12, PL21, and PL22 may form cell strings with information storage films 116 and the conductive materials CM1 to CM8.

Each cell string may include a plurality of cell transistors stacked in a direction perpendicular to substrate 111.

Figure 5:
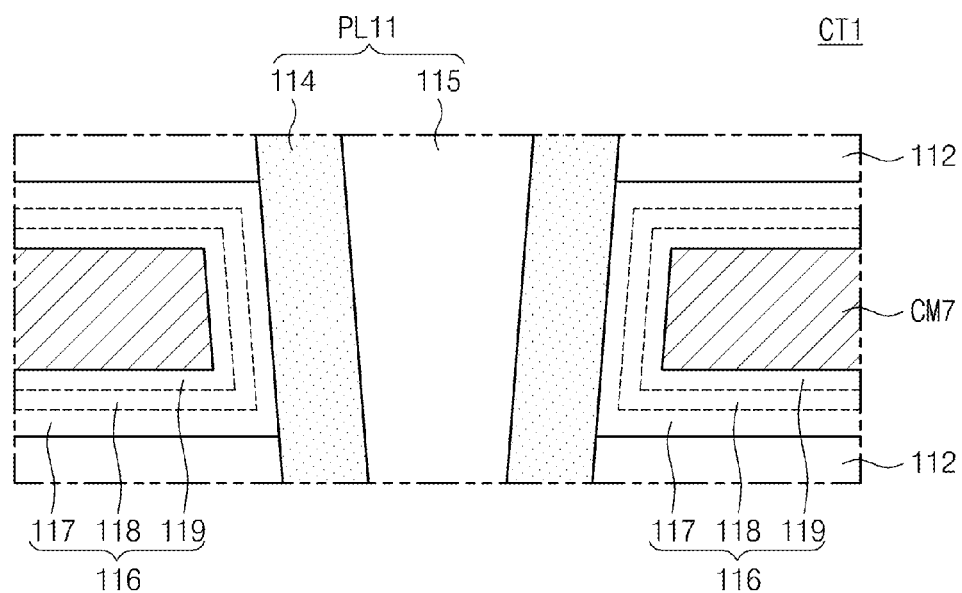
FIG. 5 is an enlarged diagram illustrating one of cell transistors in FIG. 4.

FIG. 5 is an enlarged diagram illustrating one of the cell transistors in FIG. 4. For example, a cell transistor CT1 having the seventh height among a plurality of cell transistors corresponding to a pillar PL11 at a first row and a first column is illustrated in FIG. 5.

Referring to FIGS. 4 and 5, the cell transistor CT1 may be formed of a seventh conductive material CM7, a portion of the pillar PL11 adjacent to the seventh conductive material CM7, and an information storage film provided between the conductive material CM7 and the pillar PL11. Information storage films 116 may include first, second, and third sub insulation films 117, 118, and 119.

Channel films 114 of pillars PL11, PL12, PL21, and PL22 may include the same p-type silicon as substrate 111. Channel films 114 may act as bodies of cell transistors. Channel films 114 may be formed in a direction perpendicular to substrate 111. Accordingly, channel films 114 of the pillars PL11, PL12, PL21, and PL22 may act as a vertical body. Channels formed in channel films 114 of the pillars PL11, PL12, PL21, and PL22 may be vertical channels.

Each of the plurality of conductive materials CM1 to CM8 may act as a gate (or, a control gate).

First sub insulation films 117 adjacent to the pillars PL11, PL12, PL21, and PL22 may act as a tunneling insulation film. For example, first sub insulation films 117 adjacent to the pillars PL11, PL12, PL21, and PL22 may include a thermal oxide film. First sub insulation films 117 may include a silicon oxide film.

Second sub insulation films 118 may act as a charge storage film. For example, second sub insulation films 118 may act as a charge trap film. For example, second sub insulation films 118 may include a nitride film or a metal oxide film (e.g., an aluminum oxide film, a hafnium oxide film, etc.). Second sub insulation films 118 may include a silicon nitride film.

Third sub insulation films 119 adjacent to the conductive materials CM1 to CM8 may act as a blocking insulation film. In an embodiment, third sub insulation films 119 may be formed of a single layer or multiple layers. Third sub insulation films 119 may be a high dielectric film (e.g., an aluminum oxide film, a hafnium oxide film, etc.) having a dielectric constant larger than first and second sub insulation films 117 and 118. Third sub insulation films 119 may include a silicon oxide film.

In an embodiment, first to third sub insulation films 117 to 119 may constitute ONO (oxide-nitride-oxide).

The plurality of conductive materials CM1 to CM8 acting as a gate (or, a control gate), third sub insulation films 119 acting as a block insulation film, second sub insulation films 118 acting as a charge storage film, first sub insulation films 117 acting as a tunneling insulation film, and channel films 114 acting as a vertical body may operate as cell transistors CT. For example, the cell transistors CT may be a charge trap type cell transistor.

The cell transistors CT can be used for different purposes according to their heights. For example, among the cell transistors CT, at least one cell transistor placed at the uppermost height or level (furthest from substrate 111) may be used as a string selection transistor SST. At least one cell transistor placed at the lowermost height or level (closest to substrate 111) may be used as a ground selection transistor GST. The remaining cell transistors may be used as memory cells.

The conductive materials CM1 to CM8 may each extend along a row direction (or, the first direction) and may be connected with the plurality of pillars PL11, PL12, PL21, and PL22. That is, the conductive materials CM1 to CM8 may constitute conductive lines interconnecting cell transistors CT of the semiconductor pillars (PL11 and PL12) or (PL21 and PL22) in the same row.

In an embodiment, the conductive materials CM1 to CM8 may be used as a string selection line SSL, a ground selection line GSL, or a word line WL according to their heights.

FIG. 6 is a circuit diagram illustrating an equivalent circuit of a memory block. Referring to FIGS. 3 to 6, cell strings CS11 and CS21 may be provided between a first bit line BL1 and a common source line CSL, and cell strings CS12 and CS22 may be provided between a second bit line BL2 and the common source line CSL. The cell transistors CS11, CS21, CS12, and CS22 may correspond to pillars PL11, PL21, PL12, and PL22, respectively.

The pillar PL11 at the first row and the first column may form the cell string CS11 at the first row and the first column together with conductive materials CM1 to CM8 and information storage films 116. The pillar PL12 at the first row and a second column may form the cell string CS12 at the first row and the second column together with the conductive materials CM1 to CM8 and information storage films 116. The pillar PL21 at the second row and the first column may form the cell string CS21 at the second row and the first column together with the conductive materials CM1 to CM8 and information storage films 116. The pillar PL22 at the second row and the second column may form the cell string CS22 at the second row and the second column together with the conductive materials CM1 to CM8 and information storage films 116.

In the cell strings CS11, CS21, CS12, and CS22, cell transistors at the first height or level (i.e., closest to substrate 111) may act as a ground selection transistor GST. For example, the first conductive materials CM1 may be interconnected to form a ground selection line GSL. In the cell strings CS11, CS21, CS12, and CS22, cell transistors of the eighth height or level (i.e., furthest from substrate 111) may act as a string selection transistor SST. The string selection transistors SST may be connected with the first and second string selection lines SSL1 and SSL2.

Cell transistors of the second height may act as first memory cells MC1. Cell transistors of the third height may act as second memory cells MC2. Cell transistors of the fourth height may act as third memory cells MC3. Cell transistors of the fifth height may act as fourth memory cells MC4. Cell transistors of the sixth height may act as fifth memory cells MC5. Cell transistors of the seventh height may act as sixth memory cells MC6.

Cell strings in the same row may share a string selection line. Cell strings in different rows may be connected with different string selection lines, respectively. The first and second string selection lines SSL1 and SSL2 may correspond to the eighth conductive materials CM8, respectively. That is, it is understood that the pillars PL11, PL12, PL21, and PL22, that is, rows of the cell strings CS11, CS12, CS21, and CS22 are defined by the first and second string selection lines SSL1 and SSL2.

In an exemplary embodiment, the first conductive materials CM1 may be interconnected to form a ground selection line GSL. The first word line WL1 may be formed by connecting the second conductive materials CM2 in common. The third conductive materials CM3 may be interconnected to form the second word line WL2. The fourth conductive materials CM4 may be interconnected to form the third word line WL3. The fourth word line WL4 may be formed by interconnecting the fifth conductive materials CM5. The sixth conductive materials CM6 may be interconnected to form the fifth word line WL5. The seventh conductive materials CM7 may be interconnected to form the sixth word line WL6.

The common source line CSL may be connected in common with the cell strings CS11, CS12, CS21, and CS22. For example, the common source line CSL may be formed by interconnecting first to third doping regions 311 to 313.

Memory cells of the same height may be connected in common with a word line. Accordingly, when a word line of a specific height is selected, all cell strings CS11, CS12, CS21, and CS22 connected with the selected word line may be selected.

Cell strings of different rows may be connected with different string selection lines, respectively. Accordingly, cell strings (CS11 and CS12) or (CS21 and CS22) of an unselected row among cell strings CS11, CS12, CS21, and CS22 connected with the same word line may be electrically separated from the bit lines BL1 and BL2 by selecting and unselecting the first and second string selection lines SSL1 and SSL2. Cell strings (CS21 and CS22) or (CS11 and CS12) of a selected row may be electrically connected with the bit lines BL1 and BL2.

That is, rows of the cell strings CS11, CS12, CS21, and CS22 may be selected by selecting and unselecting the first and second string selection lines SSL1 and SSL2. Columns of cell strings in the selected row may be selected by selecting the bit lines BL1 and BL2.

A programming operation and a read operation may be carried out by the page. That is, in cell strings connected with the same string selection line, memory cells connected with the same word line may be programmed at the same time. Further, in cell strings connected with the same string selection line, memory cells connected with the same word line may be read at the same time. At programming and reading, an address ADDR input from an external device may correspond to a specific page.

An erase operation may be performed by the memory block. Memory cells included in a memory block are erased at the same time. At erasing, an address ADDR input from an external device may correspond to a memory block.

In FIGS. 3 to 6, the memory block BLK1 is assumed to have the first to eighth heights and to include 2-by-2 cell strings. However, the number of cell strings disposed in a column direction may be proportional to a height of the memory block BLK1. In an exemplary embodiment, if the memory block BLK1 has the first to eighth heights, it may include 1-by-8 cell strings. In this case, the memory block BLK1 may be connected with eight string selection lines and a ground selection line. If the memory block BLK1 has the first to sixteenth heights, it may include 1-by-16 cell strings. In this case, the memory block BLK1 may be connected with 16 string selection lines and a ground selection line.

In FIGS. 3 to 6, the memory block BLK1 is assumed to have two columns of cell strings. However, the inventive concept is not limited thereto. That is, it is well understood that the memory block BLK1 may be configured to include three or more columns of cell strings and to be connected to three or more bit lines.

Figure 7:
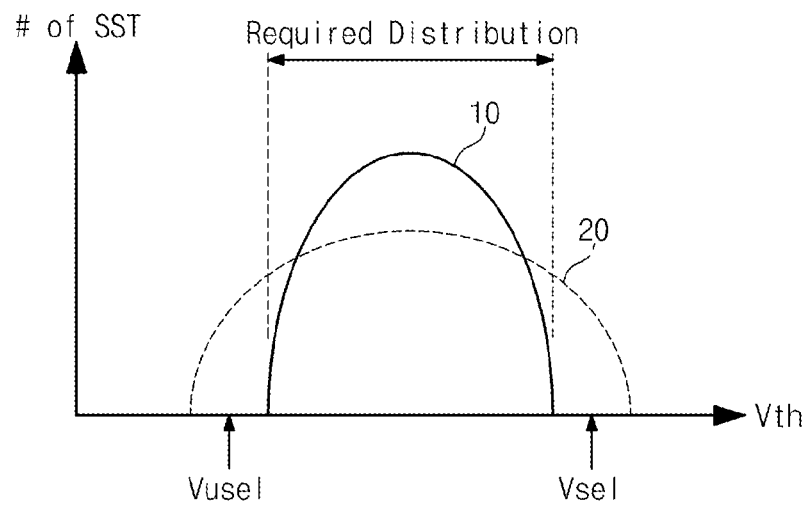
FIG. 7 is a diagram illustrating a variation in a threshold voltage distribution of string selection transistors due to a process error.

FIG. 7 is a diagram illustrating a variation in a threshold voltage distribution of string selection transistors due to a process error. In FIG. 7, a string selection voltage Vsel may be a voltage supplied to a selected string selection line. A string non-selection voltage Vusel may be a voltage supplied to an unselected string selection line.

It is assumed that a threshold voltage distribution of string selection transistors SST has a first range 10. First range 10 may correspond to a required threshold voltage distribution of the string selection transistors SST. Referring to FIGS. 6 and 7, threshold voltages of the string selection transistors SST may be less than the string selection voltage Vsel. If the string selection voltage Vsel is supplied to string selection lines SSL1 and SSL2, string selection transistors SST may be turned on. Thus, cell strings CS11, CS12, CS21, and CS22 may be electrically connected to bit lines BL1 and BL2.

Threshold voltages of the string selection transistors SST may be greater than the string non-selection voltage Vusel. When the string non-selection voltage Vusel is supplied to the string selection lines SSL1 and SSL2, the string selection transistors SST may be turned off. Thus, the cell strings CS11, CS12, CS21, and CS22 may be electrically isolated from the bit lines BL1 and BL2.

A process error may arise due to various causes such as a shape of a cell transistor CT (refer to FIG. 5) operating as a string selection transistor, a shape of a pillar PL (refer to FIGS. 3 and 4) providing a vertical-direction body, a location of a string selection transistor, and the like. For example, a threshold voltage distribution of the string selection transistors SST may have a second range 20 which is in this example is wider than first range 10 due to a process error described in relation to FIG. 3. In another example, a nonvolatile memory including memory cells stacked on a substrate can include more memory cells as compared with a nonvolatile memory including two-dimensional memory cells. As a result, a process error may increase. Thus, a threshold voltage distribution of the string selection transistors SST may have second range 20.

Assume that a threshold voltage distribution of the string selection transistors has second range 20. In that case, there may exist a string selection transistor having a threshold voltage greater than the string selection voltage Vsel. Accordingly, when the string selection voltage Vsel is applied to the string selection lines SSL1 and SSL2, such a string selection transistor may not be turned on. That is, although the string selection lines SSL1 and SSL2 are all selected, a cell string electrically which is still isolated from the bit lines BL1 and BL2 may exist.

A string selection transistor having a threshold voltage less than the string non-selection voltage Vusel may exist. When the string non-selection voltage Vusel is applied to the string selection lines SSL1 and SSL2, such a string selection transistor may be turned on. Thus, although the string selection lines SSL1 and SSL2 are all unselected, a cell string electrically connected to the bit lines BL1 and BL2 may exist.

Figure 8:
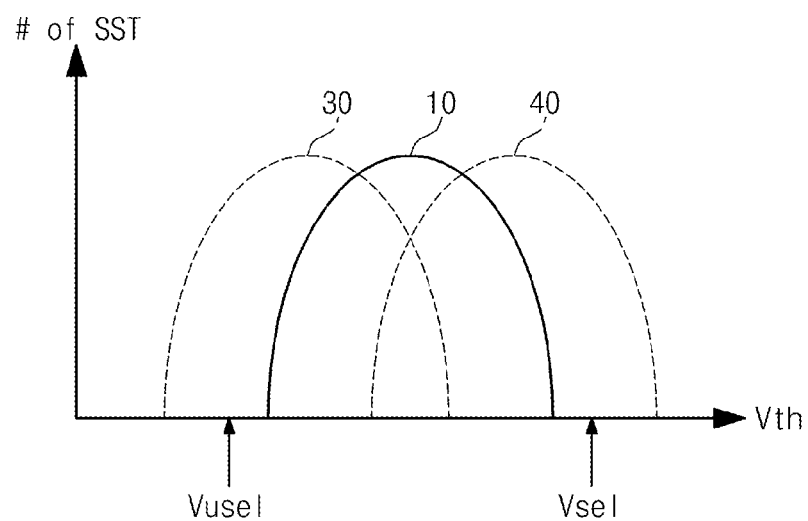
FIG. 8 is a diagram illustrating variations in threshold voltage distributions of string selection transistors due to a temperature variation.

FIG. 8 is a diagram illustrating variations in threshold voltage distributions of string selection transistors due to a temperature variation. In FIG. 8, a string selection voltage Vsel may be a voltage supplied to a selected string selection line. A string non-selection voltage Vusel may be a voltage supplied to an unselected string selection line.

A nonvolatile memory 100 (refer to FIG. 1) including memory cells stacked on a substrate may consume a current larger in amount than that of a nonvolatile memory including two-dimensional memory cells. Thus, the nonvolatile memory including two-dimensional memory cells may experience a large amount of a temperature variation due to the current consumption. A threshold voltage distribution of the string selection transistors SST may be shifted due to a temperature variation of a nonvolatile memory 100 (refer to FIG. 1).

Assume that a threshold voltage distribution of the string selection transistors SST is shifted to a third range 30 from first range 10 due to a temperature variation. For example, as a temperature of nonvolatile memory 100 increases, a threshold voltage distribution of the string selection transistors SST may be shifted into third range 30. At this time, a string selection transistor having a threshold voltage less than the string non-selection voltage Vusel may exist. When the string non-selection voltage Vusel is supplied to string selection lines SSL1 and SSL2, such a string selection transistor may be turned on. That is, although the string selection lines SSL1 and SSL2 are all unselected, a cell string electrically connected to bit lines BL1 and BL2 may exist.

It is assumed that a threshold voltage distribution of the string selection transistors SST is shifted to a fourth range 40 from first range 10 due to a temperature variation. For example, as a temperature of nonvolatile memory 100 decreases, a threshold voltage distribution of the string selection transistors SST may be shifted into fourth range 40. Although the string selection voltage Vsel is supplied to the string selection lines SSL1 and SSL2, a cell string electrically isolated from the bit lines BL1 and BL2 may exist.

Like the string selection transistors SST, ground selection transistors GST may not have a required threshold voltage distribution. For example, a threshold voltage distribution of the ground selection transistors GST may be different from a required threshold voltage distribution due to a process error, a temperature variation of a nonvolatile memory, and the like.

Figure 9:
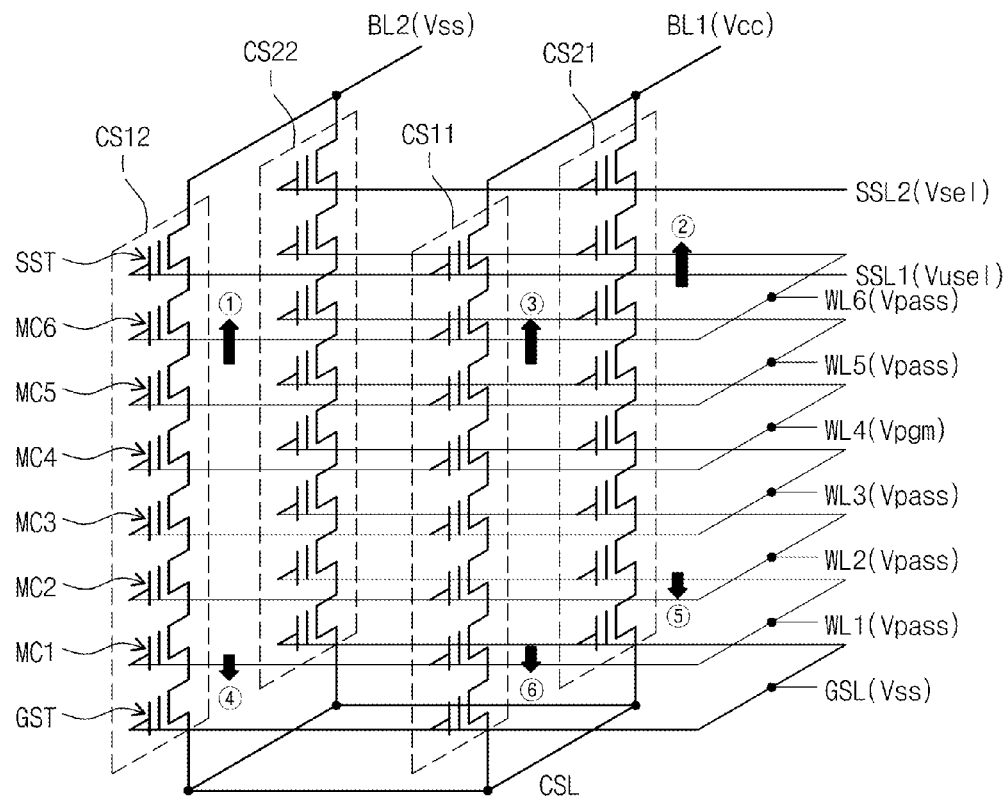
FIG. 9 is a diagram illustrating voltages applied to a first memory block at programming.

FIG. 9 is a diagram illustrating voltages applied to a first memory block during a programming operation. It is assumed that a first string selection line SSL1 is an unselected string selection line and a second string selection line SSL2 is a selected string selection line. Further, it is assumed that a fourth word line WL4 is a selected word line. With this assumption, memory cells connected to the fourth word line WL4, from among memory cells of cell strings CS21 and CS22 connected with the second string selection line SSL2 may be selected. Further, it is assumed that a first bit line BL1 is an unselected bit line and a second bit line BL2 is a selected bit line. A memory cell, connected to the selected bit line BL2 from among the selected memory cells may be programmed.

Referring to FIG. 9, a pass voltage Vpass may be applied to unselected word lines WL1 to WL3, WL5, and WL6. A program voltage Vpgm may be applied to the selected word line WL4. In an embodiment, the pass voltage Vpass may be a high voltage. The program voltage Vpgm may be a voltage which is greater than the pass voltage Vpass. The pass voltage Vpass and the program voltage Vpgm may be generated by a voltage generator 130 (refer to FIG. 1), and may be applied to word lines WL1 to WL6 via an address decoder 120 (refer to FIG. 1).

A power supply voltage Vcc and a ground voltage Vss may be supplied to a first bit line BL1 and a second bit line BL2, respectively. A string non-selection voltage Vusel and a string selection voltage Vsel may be supplied to a first string selection line SSL1 and a second string selection line SSL2, respectively. At this time, it is assumed that the string non-selection voltage Vusel and the string selection voltage Vsel are identical to a ground voltage Vss and a power supply voltage Vcc. The ground voltage Vss may be supplied to the ground selection line GSL.

First there will be described the case where the threshold voltages of string selection transistors SST form a required threshold voltage distribution.

When a ground voltage Vss is supplied to gates of ground selection transistors GST, the ground selection transistors GST may be turned off. In that case, cell strings CS11, CS12, CS21, and CS22 may be electrically isolated from a common source line CSL.

String selection transistors connected to a first string selection line SSL1 may be turned off. In that case, the cell strings CS11 and CS12 may be electrically isolated from bit lines BL1 and BL2. If voltages Vpass and Vpgm applied to the cell strings CS11 and CS12 via word lines WL1 to WL6 are increased, voltages of bodies of the cell strings CS11 and CS12 also may be increased. Memory cells (connected to a word line WL4) of the cell strings CS11 and CS12 may be program inhibited.

A power supply voltage for program inhibition may be applied to the first bit line BL1. A string selection transistor, connected to the first bit line BL1, from among string selection transistors connected to a second string selection line SSL2 being a selected string selection line may be turned off. The cell string CS21 may be electrically isolated from the first bit line BL1. Memory cells of the cell string CS21 may be program inhibited.

A string selection transistor of a cell string CS22, connected to a selected bit line BL2, from among string selection transistors connected to the second string selection line SSL2 may be turned on. The cell string CS22 may be electrically connected to the second bit line BL2. The cell string CS22 may receive a ground voltage Vss via the second bit line BL2. A channel may be formed at vertical bodies of the cell string CS22 due to a difference between the pass voltage Vpass and the ground voltage Vss and a difference between the program voltage Vpgm and the ground voltage Vss. The formed channel may maintain the ground voltage due to a ground voltage Vss received via the second bit line BL2. A fourth memory cell of the cell string CS22 may be programmed by a difference between the program voltage Vpgm of the fourth word line WL4 and the ground voltage Vss of the formed channel.

Next, there will be described the case where the threshold voltage of one or more string selection transistors SST fall out of a required threshold voltage distribution.

For example, assume that a string selection transistor exists which has a threshold voltage less than a string non-selection voltage Vusel. As a specific example, a threshold voltage of a string selection transistor in the cell string CS12 may be less than the string non-selection voltage Vusel. In this case, there may be generated a problem where the cell string CS12 is connected to the second bit line BL2 due to turning-on of a string selection transistor of the cell string CS12.

In another example, even though a threshold voltage of a string selection transistor of the cell string CS12 is greater than the string non-selection voltage Vusel, a difference between a threshold voltage of a string selection transistor of the cell string CS12 and the string non-selection voltage Vusel may be relatively small. In this case, even though the string selection transistor of the cell string CS12 is turned off, a leakage current may flow via a string selection transistor from the cell string CS12 when a voltage of a vertical body of the cell string CS12 is increased (①) in FIG. 9). Likewise, a leakage current may flow via a string selection transistor of a cell string CS11 (③ in FIG. 9).

A leakage current may flow via a string selection transistor of a cell string CS21. A string selection transistor may be turned off under the following condition.

$$V_{DS} > V_{GS} - V_{th}$$

Herein, $V_{DS}$ may indicate a voltage between one end (e.g., the drain) and the other end (e.g., the source) of the string selection transistor, $V_{GS}$ may indicate a voltage between a gate and the other end (e.g., the source) of the string selection transistor, and Vth may indicate a threshold voltage for the transistor. One end of each string selection transistor may be connected to the first bit line BL1 or the second bit line BL2. The other end of each string selection transistor may be connected to a sixth memory cell MC6 of each cell string.

It is assumed that a voltage $V_{DS}$ (corresponding to a bit line voltage) between one end and the other end of a string selection transistor and a voltage $V_{GS}$ (corresponding to a voltage of a string selection line) between a gate and the other end are fixed. If a threshold voltage Vth decreases, the voltage ($V_{GS}$–Vth) may increase such that the value of ($V_{GS}$–Vth) approaches to VDS. At this time, a leakage current may be generated between one end and the other end of the string selection transistor.

For example, string selection transistors of the cell strings CS12 and CS21 may receive the same voltage via a corresponding bit line and a corresponding string selection line. At this time, if a threshold voltage Vth is decreased, a leakage current may flow via string selection transistors from bodies of the cell strings CS12 and CS21 (①, ② in FIG. 9).

For another example, assume that a transistor having a threshold voltage greater than a string selection voltage Vsel of the string selection transistors SST exists. As a specific example, a threshold voltage of a string selection transistor of the cell string CS22 may be greater than the string selection voltage Vsel. In this case, there may be generated a problem that the cell string CS22 is electrically isolated from the second bit line BL2 due to turning-off of the string selection transistor in the cell string CS22.

Likewise, leakage currents may flow via ground selection transistors from the cell strings CS11, CS12, CS21, and CS22. For example, if threshold voltages of the ground selection transistors GST are decreased, a difference between threshold voltages of the ground selection transistors and the ground voltage Vss may be relatively small. This may enable a leakage current to flow via ground selection transistors from the cell strings CS11, CS12, CS21, and CS22 when voltages of vertical bodies of the cell strings CS11, CS12, CS21, and CS22 are increased (④, ⑤, and ⑥ in FIG. 9).

Figure 10:
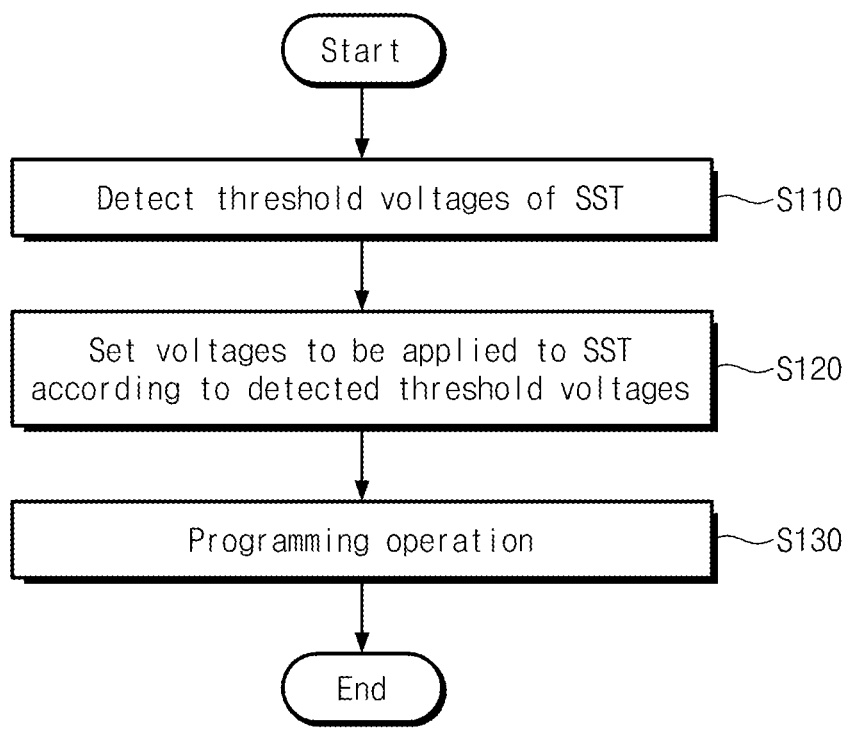
FIG. 10 is a flowchart for describing a control method of a nonvolatile memory in FIG. 1.
Figure 11:
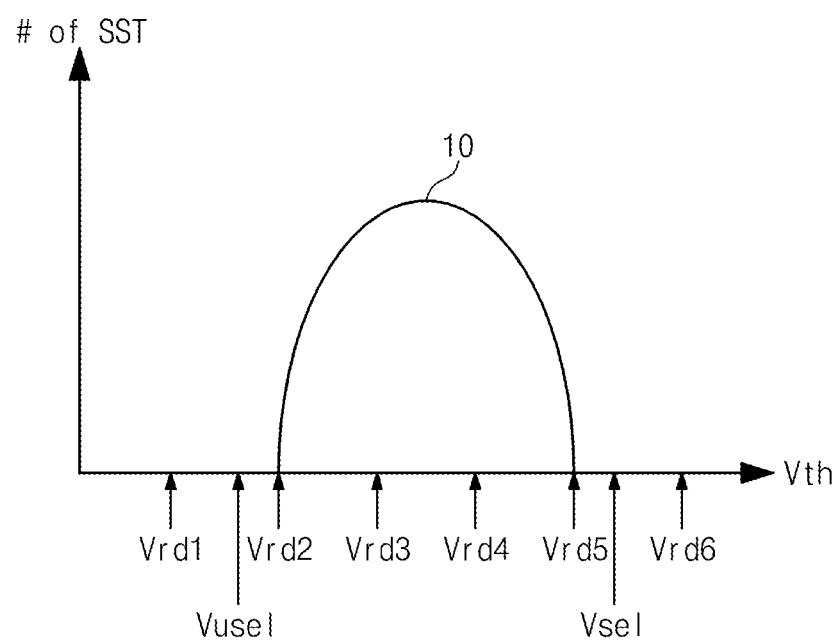
FIG. 11 is a diagram for describing a method of detecting threshold voltages of string selection transistors.

FIG. 10 is a flowchart for describing a control method of a nonvolatile memory in FIG. 1. FIG. 11 is a diagram for describing a method of detecting threshold voltages of string selection transistors, which may be employed in the control method illustrated in FIG. 10.

Referring to FIGS. 1, 9, and 10, in operation S110, threshold voltages of string selection transistors may be detected. Control logic 150 may detect threshold voltages of string selection transistors by performing at least one read operation. For example, threshold voltages of string selection transistors within a memory block BLK1 of a memory cell array 110 may be detected. In another example, threshold voltages of string selection transistors within some memory blocks of memory blocks BLK1 to BLKz of memory cell array 110 may be detected. In still another example, threshold voltages of string selection transistors of all memory blocks BLK1 to BLKz of memory cell array 110 may be detected. In other examples, a unit of the detecting operation may be changed variously.

A point of time when threshold voltages of string selection transistors are detected may not be limited. For example, threshold voltages of string selection transistors may be detected whenever a programming operation is executed. In another example, threshold voltages of string selection transistors may be detected whenever a plurality of programming operations are executed. In still another example, threshold voltages of string selection transistors may be detected at specific times, for example periodically.

Information on the detected threshold voltages may be stored in a status register 151.

Referring to FIG. 11, first range 10 may correspond to the case where string selection transistors SST have a required threshold voltage distribution. In that case, where string selection transistors SST have first range 10, at programming a string non-selection voltage Vusel may be applied to unselected string selection lines, and a string selection voltage Vsel may be applied to selected string selection lines.

In an embodiment, threshold voltages of string selection transistors SST may be ascertained (or, estimated) by reading the string selection transistors SST using a plurality of read voltages Vrd1 to Vrd6. A threshold voltage distribution of the string selection transistors SST may be detected on the basis of the plurality of read voltages Vrd1 to Vrd6. For example, the lowest threshold voltage and the highest threshold voltage may be detected using the plurality of read voltages Vrd1 to Vrd6.

In another embodiment, threshold voltages of string selection transistors SST may be ascertained (or, estimated) by reading the string selection transistors SST using one read voltage (e.g., Vrd3). At this time, the number of string selection transistors each having a threshold voltage less than the used read voltage may be ascertained. If the number of string selection transistors ascertained to have a threshold voltage less than the used read voltage is large, then this may mean that a threshold voltage distribution of the string selection transistors becomes narrow (or, wide).

In still another embodiment, the number of string selection transistors each having a threshold voltage less than each of read voltages may be ascertained by performing read operations using the read voltages.

It is possible to estimate a threshold voltage distribution of the string selection transistors SST by the above-described methods. An embodiment in FIG. 11 may be exemplary, and a method of detecting threshold voltages of the string selection transistors SST may not be limited to a method described in relation to FIG. 11.

A method of detecting threshold voltages of the string selection transistors SST is described with reference to FIG. 11. But, it is well understood that threshold voltages of ground selection transistors GST are detected in the same manner as the string selection transistors SST.

Returning to FIG. 10, in operation S120, voltages to be supplied to the string selection transistors may be adjusted according to the detected threshold voltages. Control logic 150 may establish a voltage generator 130 so as to adjust voltages to be supplied to the string selection transistors, based on the information on the detected threshold voltages stored in status register 151.

In an embodiment, whether to adjust voltages to be applied to the string selection transistors may be decided according to the detected threshold voltages. For example, when a distribution of the detected threshold voltages gets out of a required threshold voltage distribution 10 (refer to FIG. 11), voltages to be supplied to the string selection transistors may be adjusted. Voltages to be supplied to the string selection transistors may be adjusted according to the detected threshold voltages.

A voltage to be supplied to the string selection transistors SST (refer to FIG. 9) may be received via a string selection line SSL (refer to FIG. 9) and a bit line BL (refer to FIG. 9). Voltages to be supplied to the string selection transistors may be adjusted by adjusting voltages to be applied to respective string selection lines and respective bit lines.

For example, assume that a threshold voltage distribution of the string selection transistors SST increases. Voltages to be applied to the string selection lines and the bit lines may be adjusted such that string selection transistors of selected cell strings are stably turned on. For example, a voltage to be supplied to a selected string selection line may increase, and a voltage to be supplied to a selected bit line may decrease.

For example, assume that a threshold voltage distribution of the string selection transistors SST decreases. Voltages to be applied to the string selection lines and the bit lines may be adjusted such that string selection transistors of unselected cell strings are stably turned off. For example, a voltage to be supplied to a selected bit line BL2 may increase such that a string selection transistor of a cell string CS12 being an unselected cell string is stably turned off. A voltage to be supplied to a selected string selection line SSL2 may decrease such that a string selection transistor of the cell string CS12 being the unselected cell string is stably turned off.

A voltage to be applied to each ground selection transistor GST (refer to FIG. 9) may be received via a ground selection line GSL (refer to FIG. 9) and a common source line CSL (refer to FIG. 9). Voltages to be applied to ground selection transistors GST may be adjusted by adjusting voltages to be supplied to the ground selection line GSL and the common source line CSL. During a programming operation, voltages to be supplied to the ground selection line GSL and the common source line CSL may be adjusted such that the ground selection transistors GST are stably turned off.

In operation S130, a programming operation may be executed. At a program operation, voltages to be supplied to string selection transistors may be voltages adjusted in operation S120.

With the inventive concept, an operating method with improved reliability may be provided by detecting threshold voltages of string selection transistors to adjust voltages to be supplied to the string selection transistors.

Figure 12:
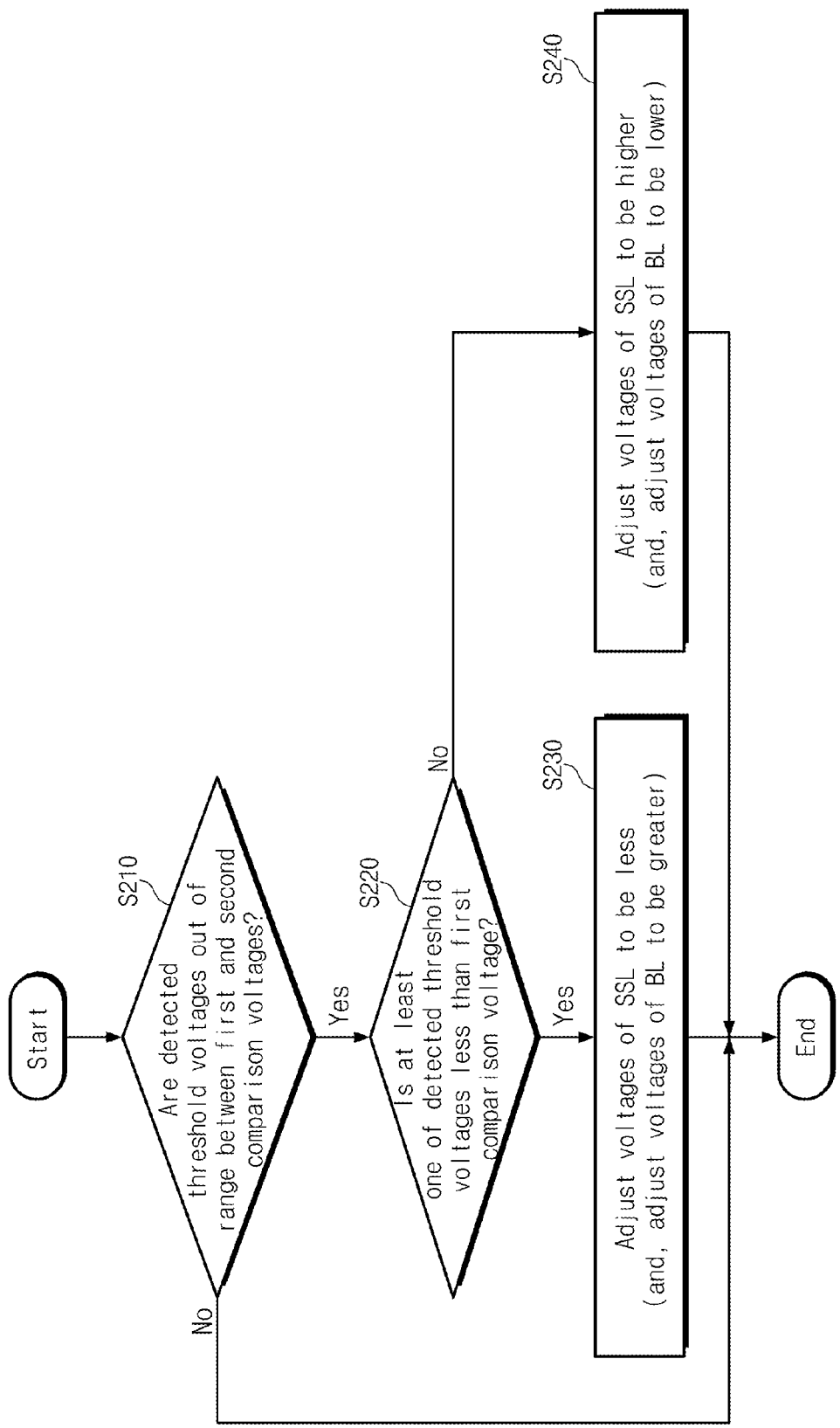
FIG. 12 is a flowchart for describing operations S120 and S130 in FIG. 11 in detail.

FIG. 12 is a flowchart for describing operations S120 and S130 in FIG. 10 in detail. Referring to FIGS. 10 and 12, operations S210 and S220 may correspond to operation S120, and operations S230 and S240 may correspond to operation S130.

In operation S210, it may be ascertained whether detected threshold voltages are out of a required threshold voltage distribution placed between a first comparison voltage and a second comparison voltage. In an embodiment, the first comparison voltage may correspond to the lowest voltage of a required threshold voltage distribution, and the second comparison voltage may correspond to the highest of the required threshold voltage distribution (see, e.g., FIGS. 7, 8 and 11). For example, the first and second comparison voltages may have the same levels as the second and fifth read voltages Vrd2 and Vrd5 (refer to FIG. 11). If the detected threshold voltages get out of the required threshold voltage distribution, the method proceeds to operation S220. If the detected threshold voltages are not out of the required threshold voltage distribution, voltages to be supplied to selection transistors may not be adjusted.

In operation S220, whether at least one of the detected threshold voltages is less than the first comparison voltage may be ascertained. If at least one of the detected threshold voltages is less than the first comparison voltage, the method proceeds to operation S230. However if it is ascertained that none of the detected threshold voltages is less than the first comparison voltage, that is, in a case where at least one of the detected threshold voltages is greater than the first comparison voltage, the method proceeds to operation S240.

In operation S230, voltages of string selection lines may be adjusted to become decreased. In an embodiment, a voltage to be supplied to a selected string selection line SSL2 may be adjusted to be less than a string selection voltage Vsel (refer to FIG. 11). A voltage to be supplied to an unselected string selection line SSL1 may be adjusted to be less than a string non-selection voltage Vusel (refer to FIG. 11). In an embodiment, as the detected threshold voltages are decreased, voltages of the string selection lines may be adjusted to become decreased, too.

Voltages to be supplied to bit lines BL1 and BL2 may be adjusted to become increased. In an embodiment, a voltage to be supplied to a selected bit line BL2 may be adjusted to be greater than a ground voltage Vss, and a voltage to be supplied to an unselected bit line BL1 may be adjusted to be greater than a power supply voltage Vcc. In an embodiment, as the detected threshold voltages are decreased, voltages to be supplied to the bit lines may be adjusted to become increased.

In operation S240, voltages of string selection lines may be adjusted to become increased. In an embodiment, as the detected threshold voltages become increased, voltages of the string selection lines may be adjusted to become increased, too. For example, a voltage to be supplied to a selected string selection line SSL2 may be adjusted to be greater than a string selection voltage Vsel. Voltages of bit lines may be adjusted to become decreased. As the detected threshold voltages are increased, voltages of the bit lines may be adjusted to become less.

Figure 13:
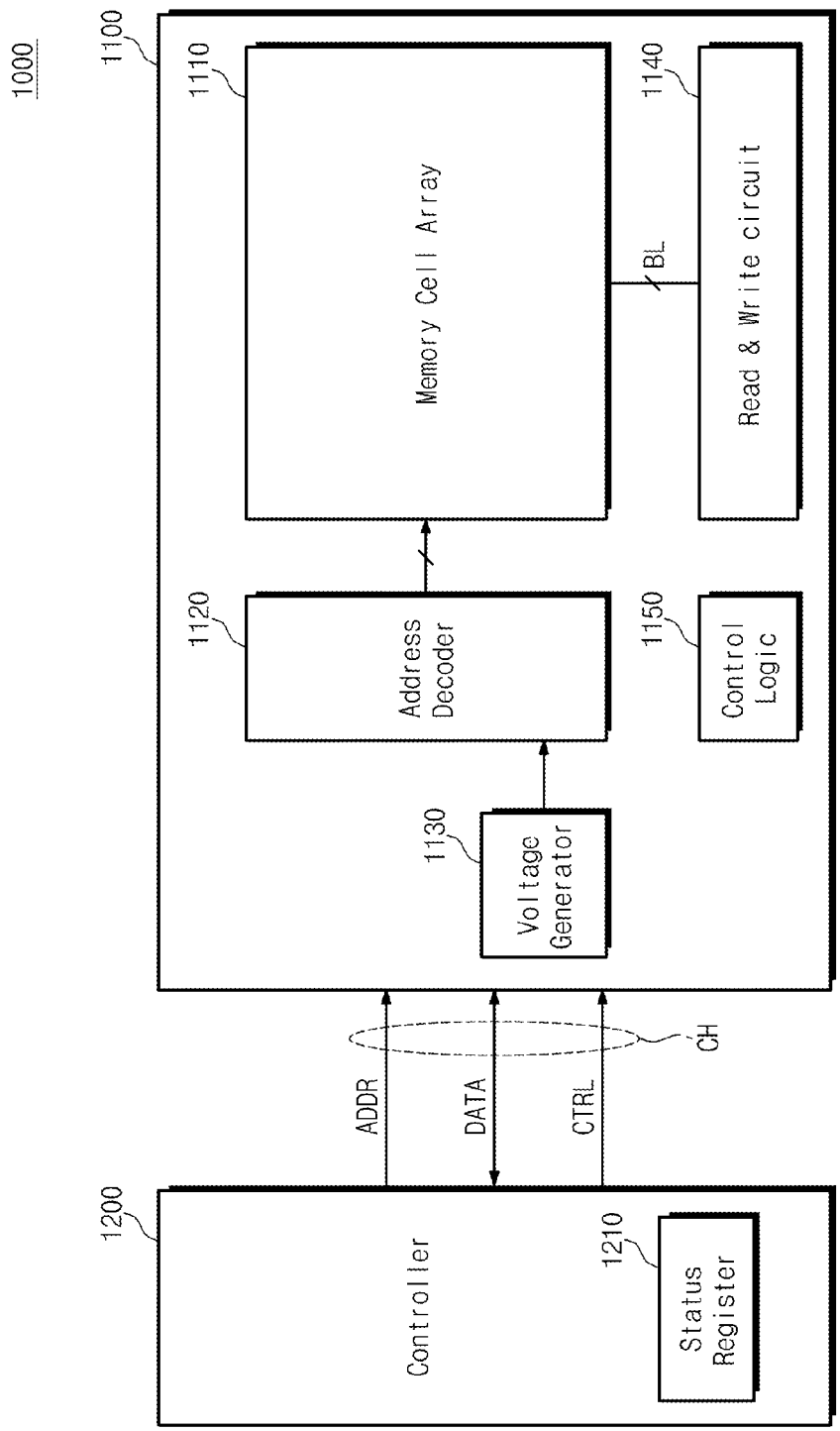
FIG. 13 is a block diagram illustrating a memory system according to an embodiment of the inventive concept.

FIG. 13 is a block diagram illustrating a memory system according to an embodiment of the inventive concept. Referring to FIG. 13, a memory system 1000 may include a nonvolatile memory 1100 and a controller 1200.

Nonvolatile memory 1100 may include a memory cell array 1110, an address decoder 1120, a voltage generator 1130, a read and write circuit 1140, and control logic 1150. Nonvolatile memory 1100 may receive an address ADDR and a control signal CTRL from controller 1200, and may exchange data with controller 1200. In an embodiment, the address ADDR, data DATA, and the control signals may be transferred via one channel CH. The address ADDR may be received by address decoder 1120, and the control signal CTRL may be received by control logic 1120. The data DATA may be received by read and write circuit 1140 during a programming operation, and may be transferred from read and write circuit 1140 during a read operation.

Memory cell array 1110, address decoder 1120, voltage generator 1130, and read and write circuit 1140 may be identical to a memory cell array 110, address decoder 120, voltage generator 130, and read and write circuit 140 illustrated in FIG. 1, and a description thereof is thus omitted.

Control logic 1150 may sense threshold voltages of string and ground selection transistors under the control of controller 1200, and may send information on the sensed threshold voltages to controller 1200.

Control logic 1150 may adjust voltages to be applied to string and ground selection transistors according to the control of controller 1200. Controller 1200 may send information associated with voltages to be applied to string and ground selection transistors. Control logic 1150 may adjust voltages to be applied to string and ground selection transistors according to the sent information. For example, control logic 1150 may establish voltage generator 1130 so as to generate the adjusted voltages during a programming operation.

Controller 1200 may be coupled with a host and nonvolatile memory 1100. Controller 1200 may be configured to provide an interface between nonvolatile memory 1100 and the host. Controller 1200 may be configured to drive firmware for controlling nonvolatile memory 1100.

Controller 1200 may include a status register 1210. Status register 1210 may store information associated with string and ground selection transistors of memory cell array 1110.

Controller 1200 may be configured to access nonvolatile memory 1100 in response to a request from the host. For example, controller 1200 may send a control signal CTRL to control read, program, and erase operations of nonvolatile memory 1100. During a read operation, controller 1200 may send an address ADDR. During a programming operation, controller 1200 may send the address ADDR and data. At erasing, controller 1200 may send the address ADDR.

Controller 1200 may be configured to control a background operation of nonvolatile memory 1100. In an embodiment, controller 1200 may send a control signal (e.g., a status read control signal) for controlling nonvolatile memory 1100 so as to sense threshold voltages of selected memory cells and to send information associated with the sensed threshold voltages. Nonvolatile memory 1100 may sense threshold voltages of selected memory cells to send information associated with the sensed threshold voltages to controller 1200, in response to the status read control signal. Controller 1200 may store information, associated with threshold voltages of string and ground selection transistors, in status register 1210.

Controller 1200 may adjust voltages to be applied to the string and ground selection transistors at programming according to information on threshold voltages stored in status register 1210.

In an embodiment, controller 1200 may further include constituent elements such as a RAM, a processing unit, a host interface, and a memory interface. The RAM may be used as a working memory of the processing unit, a cache memory between nonvolatile memory 1100 and the host, or a buffer memory between nonvolatile memory 1100 and the host. Further, the RAM may be used as status register 1210. The processing unit may control an overall operation of controller 1200.

The host interface may include the protocol for executing data exchange between the host and controller 1200. For example, the host interface may communicate with an external device (e.g., the host) via at least one of various protocols such as an USB (Universal Serial Bus) protocol, an MMC (MultiMedia Card) protocol, a PCI (Peripheral Component Interconnection) protocol, a PCI-E (PCI-Express) protocol, an ATA (Advanced Technology Attachment) protocol, a Serial-ATA protocol, a Parallel-ATA protocol, a SCSI (Small Computer Small Interface) protocol, an ESDI (Enhanced Small Disk Interface) protocol, and an IDE (Integrated Drive Electronics) protocol. The memory interface may interface with nonvolatile memory 1100. The memory interface may include a NAND interface or a NOR interface.

Memory system 1000 may further include an error correction code (ECC) block. The ECC block may be configured to detect and correct an error of data read from nonvolatile memory 1100 using ECC. The ECC block may be provided as an element of controller 1200 or as an element of nonvolatile memory 1100.

Controller 1200 and nonvolatile memory 1100 may be integrated in a single semiconductor device. Controller 1200 and nonvolatile memory 1100 may be integrated in a single semiconductor device to form a memory card. For example, controller 1200 and nonvolatile memory device 1100 may be integrated in a single semiconductor device to form a memory card such as a PC (PCMCIA) card, a CF card, an SM (or, SMC) card, a memory stick, a multimedia card (MMC, RS- MMC, MMCmicro), a security card (SD, miniSD, microSD, SDHC), a universal flash storage (UFS) device, or the like.

Controller 1200 and nonvolatile memory 1100 may be integrated in a single semiconductor device to form a solid state drive (SSD). The SSD may include a storage device configured to store data in a semiconductor memory. If memory system 1000 is used as the SSD, it is possible to remarkably improve an operating speed of a host coupled with memory system 1000.

In some embodiments, memory system 1000 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

In an embodiment, nonvolatile memory 1100 or memory system 1000 may be packed by various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

Figure 14:
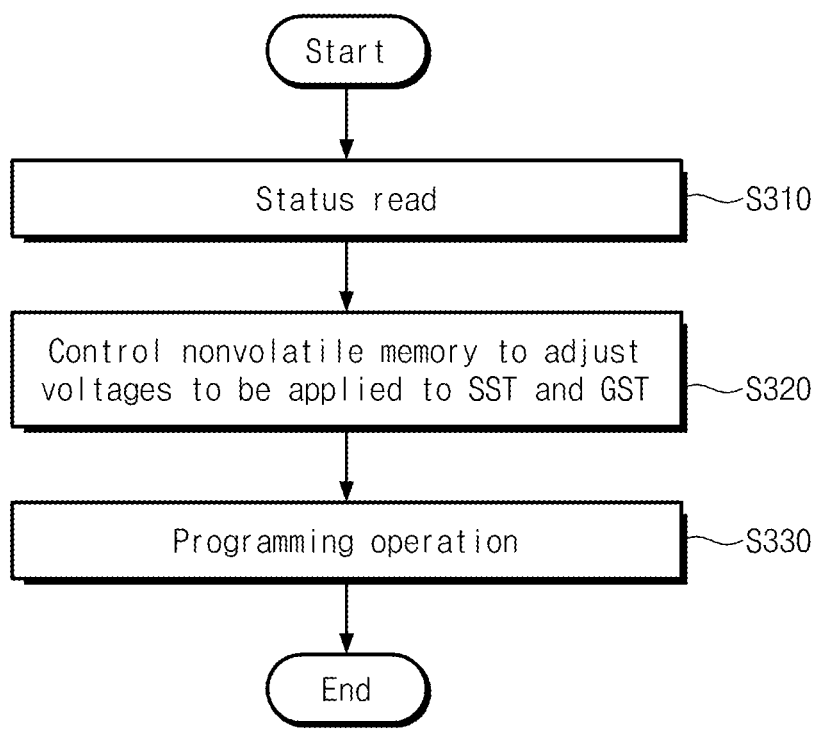
FIG. 14 is a flowchart for describing a nonvolatile memory controlling method of a controller in FIG. 13.

FIG. 14 is a flowchart for describing a nonvolatile memory controlling method of a controller in FIG. 13. Referring to FIGS. 13 and 14, in operation S310, a status read operation may be executed. A controller 1200 may send a status read control signal to a nonvolatile memory 1100. Nonvolatile memory 1100 may ascertain threshold voltages of string and ground selection transistors of a memory cell array 1110 in response to the status read control signal. Nonvolatile memory 1100 may send information on the ascertained threshold voltages to controller 1200. As a result, controller 1200 may sense threshold voltages of string and ground selection transistors via the status read operation.

In an embodiment, nonvolatile memory 1100 may ascertain threshold voltages of string selection transistors in response to a first status read control signal from controller 1200. Nonvolatile memory 1100 may ascertain threshold voltages of ground selection transistors in response to a second status read control signal from controller 1200.

In operation S320, nonvolatile memory 1100 may be controlled such that voltages to be applied to string and ground selection transistors are adjusted. For example, controller 1200 may provide nonvolatile memory 1100 with a control signal CTRL including voltage level information. Nonvolatile memory 1100 may establish a voltage generator 1130 so as to generate voltages adjusted at programming, in response to the control signal CTRL from controller 1200. The adjusted voltages may be applied to string and ground selection transistors via an address decoder 1120 during a programming operation.

In operation S330, a programming operation may be executed. Controller 1200 may provide the nonvolatile memory with a control signal CTRL indicating a programming operation. Nonvolatile memory 1100 may perform a programming operation, in which the adjusted voltages are applied to the string and ground selection transistors. In an embodiment, the adjusted voltages are applied to string selection lines SSL1 and SSL2 (refer to FIG. 9), bit lines BL1 and BL2 (refer to FIG. 9), and a ground selection line GSL (refer to FIG. 9). A pass voltage Vpass (refer to FIG. 9) may be applied to unselected word lines, and a program voltage Vpgm (refer to FIG. 9) may be applied to a selected word line.

Figure 15:
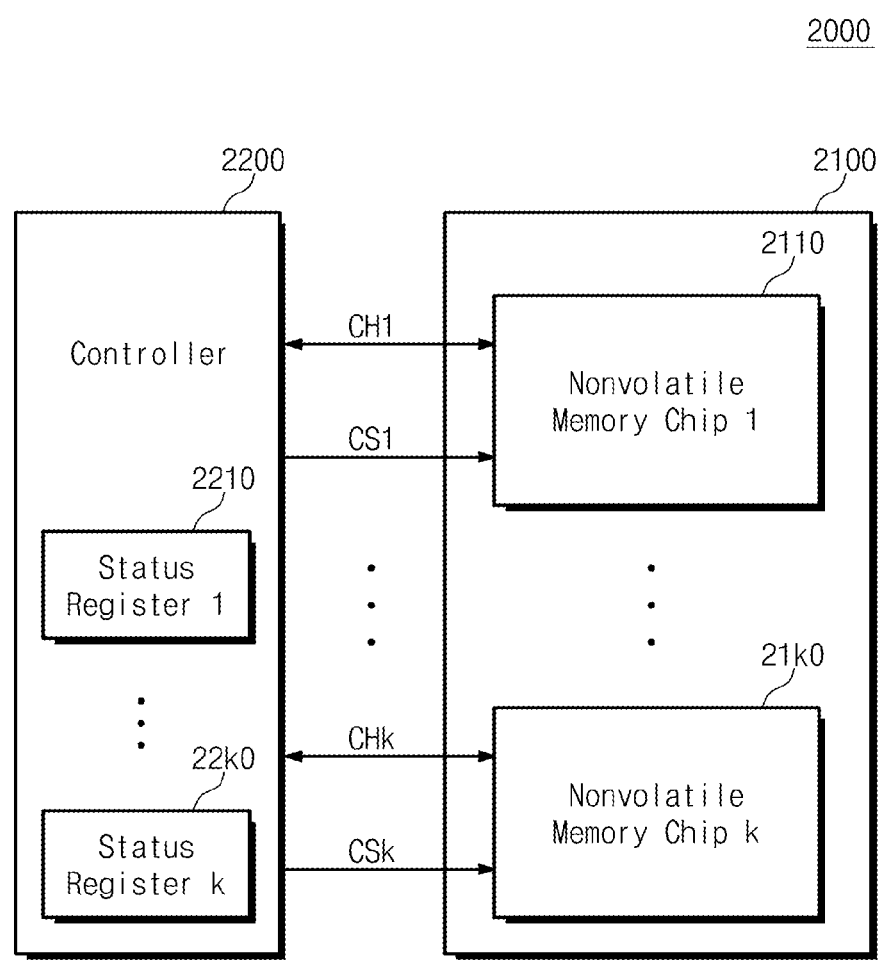
FIG. 15 is a block diagram schematically illustrating a memory system according to an embodiment of the inventive concept.

FIG. 15 is a block diagram schematically illustrating a memory system according to an embodiment of the inventive concept. Referring to FIG. 15, a memory system 2000 may include a nonvolatile memory 2100 and a controller 2200.

Nonvolatile memory 2100 may include a plurality of nonvolatile memory chips 2110 to 21k0, each of which is configured the same as a nonvolatile memory 1100 described in relation to FIG. 13. The plurality of nonvolatile memory chips 2110 to 21k0 may be integrated to form a memory card.

Controller 2200 may control overall operations of the plurality of nonvolatile memory chips 2110 to 21k0. Controller 2200 may generate a plurality of chip selection signals CS1 to CSk, which correspond to the plurality of nonvolatile memory chips 2110 to 21k0, respectively. If a chip selection signal is activated, a nonvolatile memory chip corresponding to the activated chip selection signal may be selected.

Controller 2200 may be connected to the plurality of nonvolatile memory chips 2110 to 21k0 via a plurality of channels CH1 to CHk, respectively. Controller 220 may exchange a control signal CTRL (refer to FIG. 13), an address ADDR (refer to FIG. 13), and data DATA (refer to FIG. 13) with each nonvolatile memory chip via each channel.

Controller 2200 may include a plurality of status registers 2210 to 22k0 which correspond to the plurality of nonvolatile memory chips 2110 to 21k0, respectively. Status registers 2210 to 22k0 may be used to store information on threshold voltages of string and ground selection transistors of corresponding nonvolatile memory chips 2110 to 21k0.

In FIG. 15, status registers 2210 to 22k0 may be implemented using one memory (e.g., RAM). That is, one memory may be divided into a plurality of regions.

Controller 2200 may control a status read operation of each nonvolatile memory chip, and may adjust voltages to be applied to string and ground selection transistors of each nonvolatile memory chip. For example, a first nonvolatile memory chip 2110 may be activated by a first chip selection signal CS1. Before a programming operation, controller 2200 may send a status read control signal to first nonvolatile memory chip 2110. Controller 2200 may receive information on threshold voltages of string and ground selection transistors of first nonvolatile memory chip 2110. The input information may be stored in first status register 2210. Controller 2200 may determine voltages to be applied to the string and ground selection transistors of first nonvolatile memory device 2110 during a programming operation, according to information on threshold voltages stored in first status register 2210. Controller 2200 may control first nonvolatile memory device 2110 so as to adjust voltages to be applied to the string and ground selection transistors. Like first nonvolatile memory device 2110, controller 2200 may control status read operations of the remaining nonvolatile memory chips 2120 to 21k0 to adjust voltages to be applied to string and ground selection transistors of the remaining nonvolatile memory chips 2120 to 21k0.

Figure 16:
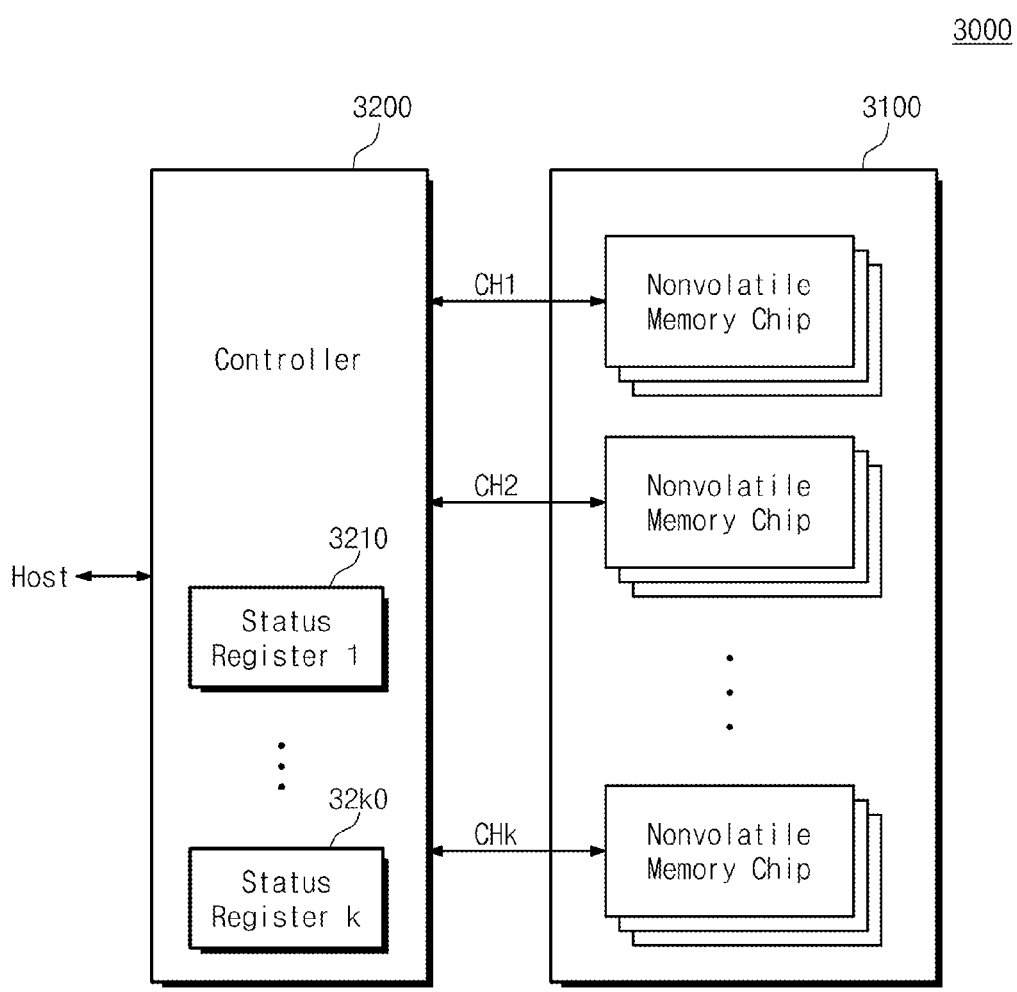
FIG. 16 is a block diagram schematically illustrating an application of a memory system in FIG. 15.

FIG. 16 is a block diagram schematically illustrating an application of a memory system in FIG. 15. Referring to FIG. 16, a memory system 3000 may include a nonvolatile memory 3100 and a controller 3200. Nonvolatile memory 3100 may include a plurality of nonvolatile memory chips.

The plurality of nonvolatile memory chips may be divided into a plurality of groups. Each group of nonvolatile memory chips may be connected to communicate with controller 3200 via one chip. Nonvolatile memory chips in one group may be selected by a chip selection signal (refer to FIG. 15), and a selected nonvolatile memory chip may communicate with controller 3200 via a common channel. In FIG. 16, there is illustrated a case where a plurality of nonvolatile memory chips communicates with controller 3200 via a plurality of channels CH1 to CHk. Each nonvolatile memory chip may operate the same as a nonvolatile memory described in relation to FIG. 15.

Controller 3200 may include a plurality of status registers 3210 to 32k0, which correspond to groups of nonvolatile memory chips, respectively. Each of status registers 3210 to 32k0 may store information on threshold voltages of string and ground selection transistors within nonvolatile memory chips of one group. For example, a status register 3210 may store information on threshold voltages of string and ground selection transistors within each nonvolatile memory chip of one group.

Figure 17:
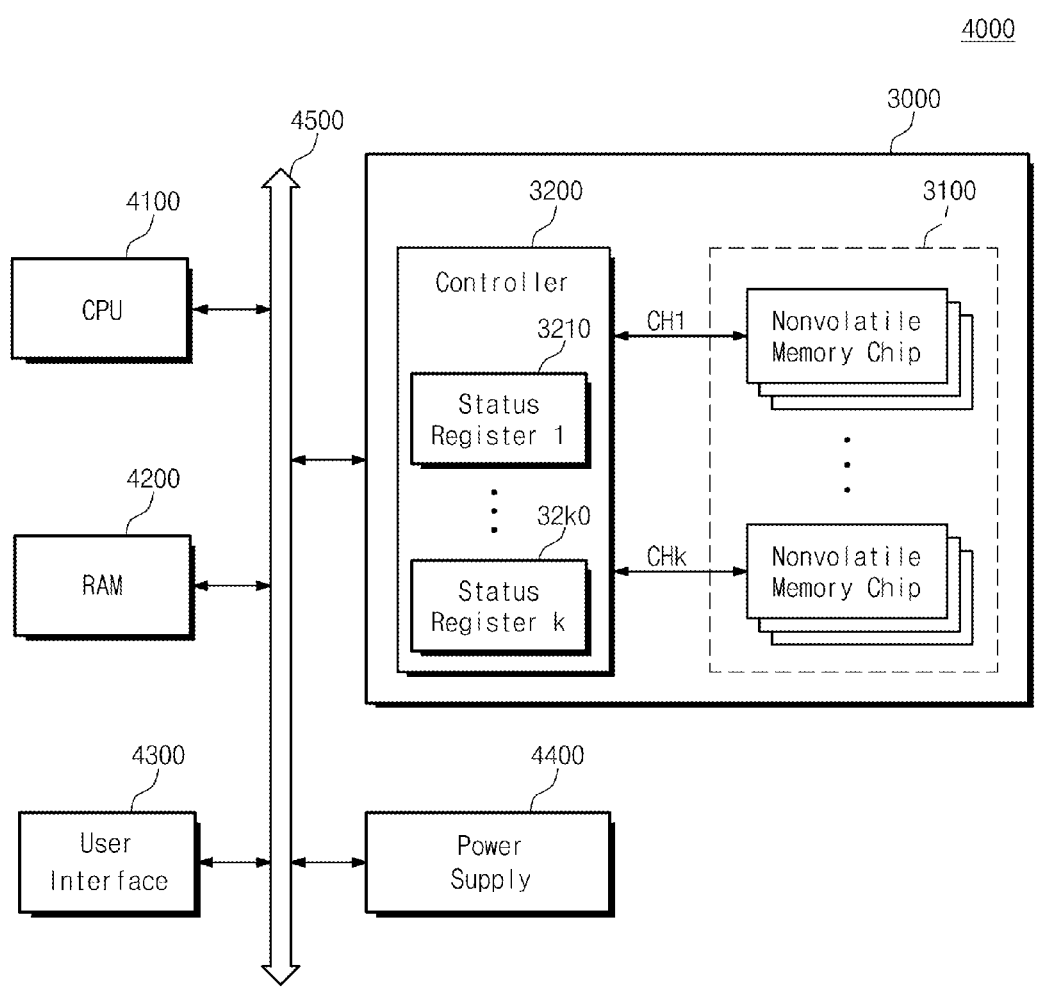
FIG. 17 is a block diagram schematically illustrating a computing system including a memory system described in FIG. 16.

FIG. 17 is a block diagram schematically illustrating a computing system including a memory system described in FIG. 16. Referring to FIG. 17, a computing system 4000 may include a CPU 4100, a RAM 4200, a user interface 4300, a power supply, and a memory system 3000.

Memory system 3000 may be connected to constituent elements 4100 to 4400 via a system bus 4500. Data provided via user interface 4300 or processed by CPU 4100 may be stored in memory system 3000.

In FIG. 17, there is illustrated a case where a nonvolatile memory 3100 is connected to system bus 4500 via controller 3200. However, nonvolatile memory 3100 can be directly connected to system bus 4500. In that case, a function of controller 3200 may be executed by CPU 4100. Functions of status registers 3210 to 32k0 may be executed by RAM 4200.

In FIG. 17, there is illustrated a memory system 3000 described in relation to FIG. 16. However, memory system 3000 can be replaced with a memory system 1000 or 2000 described in relation to FIG. 13 or 15. In an embodiment, computing system 4000 can be implemented to include all memory systems 1000, 2000, and 3000 described in relation to FIGS. 13, 15, and 16.

The inventive concept may be implemented such that threshold voltages of string selection transistors are sensed and voltages to be applied to the string selection transistors are adjusted. This may make it possible to reduce a leakage current flowing from cell strings via string selection transistors. Further, the inventive concept may be implemented such that threshold voltages of ground selection transistors are sensed and voltages to be applied to the ground selection transistors are adjusted. This may make it possible to reduce a leakage current flowing from cell strings via ground selection transistors.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. An operating method of a nonvolatile memory which includes a plurality of cell strings, each cell string having a plurality of memory cells and a string selection transistor stacked on a substrate, the operating method comprising:

reading string selection transistors of the plurality of cell strings;

selecting a voltage level according to a result of the reading; and applying a voltage having the selected voltage level to the string selection transistors.

2. The operating method of claim 1, wherein gates of the string selection transistors are connected to a string selection line, wherein the string selection transistors are connected to bit lines respectively, and wherein the voltage is applied to the string selection line.

3. The operating method of claim 2, wherein selecting the voltage level comprises:

selecting a default level if threshold voltages of the string selection transistors are higher than a first level and less than a second level according to the result.

4. The operating method of claim 3, wherein selecting the voltage level further comprises:

selecting a third level less than the default level if at least one threshold voltage of at least one string selection transistor is less than the first level; and selecting a fourth level higher than the default level if at least one threshold voltage of at least one string selection transistor is higher than the second level.

5. The operating method of claim 1, wherein gates of the string selection transistors are connected to a string select line, wherein the string selection transistors are connected to bit lines respectively, and wherein selecting the voltage level comprises selecting voltage levels to be supplied to the bit lines.

6. The operating method of claim 5, wherein selecting the voltage levels to be supplied to the bit lines comprises selecting a default voltage level to be supplied to a first string selection transistor having a threshold voltage higher than a first level and less than a second level according to the result.

7. The operating method of claim 5, wherein selecting the voltage levels to be supplied to the bit lines further comprises:

selecting a third level less than the default level to be supplied to a second string selection transistor having a threshold voltage less than the first level; and selecting a fourth level higher than the default level to be supplied to a third string selection transistor having a threshold voltage higher than the second level.

8. The operating method of claim 1, wherein reading the string selection transistors comprises:

reading the string select transistors using a first voltage level to detect first string selection transistor having a threshold voltage less than the first voltage level; and reading the string selection transistors using a second voltage level to detect second string selection transistor having a threshold voltage higher than the second voltage level.

9. The operating method of claim 1, wherein each cell string further comprises a ground selection transistor connected to a common source line; and wherein the operating method further comprises:

reading ground selection transistors of the plurality of cell strings;

selecting a second voltage level according to a result of the reading of the ground selection transistors; and applying a second voltage having the selected second voltage level to the ground selection transistors.

10. The operating method of claim 9, wherein gates of the ground selection transistors are connected to a ground selection line, and wherein the second voltage is supplied to the ground selection line.

11. The operating method of claim 10, wherein selecting the second voltage level comprises:

selecting a default level if threshold voltages of the ground selection transistors are higher than a first level and less than a second level according to the result of the reading of the ground selection transistors.

12. The operating method of claim 11, wherein selecting the second voltage level further comprises:

selecting a third level less than the default level if at least one threshold voltage of at least one ground selection transistor is less than the first level; and selecting a fourth level higher than the default level if at least one threshold voltage of at least one ground selection transistor is higher than the second level.

13. A method of controlling a nonvolatile memory which includes a plurality of cell strings, each cell string having a plurality of memory cells stacked on a substrate and a string selection transistor selecting the plurality of memory cells, the method comprising:

generating a status read control signal;

receiving information on a read result of string selection transistors of the plurality of cell strings provided from the nonvolatile memory according to the status read control signal; and controlling the nonvolatile memory such that voltages to be supplied to the string selection transistors are adjusted according to the information.

14. The method of claim 13, further comprising:

storing the information, and wherein controlling the nonvolatile memory comprises controlling the nonvolatile memory according to the stored information.

15. The method of claim 13, wherein each cell string further comprises ground selection transistor, and wherein the method further comprises:

generating a second status read control signal;

receiving second information on a read of ground selection transistors of the plurality of cell strings provided from the nonvolatile memory according to the second status read control signal; and controlling the nonvolatile memory such that voltages to be supplied to the ground selection transistors are adjusted according to the second information.

16. A method, comprising providing a nonvolatile memory which includes a plurality of cell strings, each cell string having a corresponding plurality of memory cells and a corresponding string selection transistor stacked on a substrate, wherein string selection transistors of the plurality of cell strings are connected to string selection lines;

reading the string selection transistors to detect threshold voltages; and a first string selection line is selected and a threshold voltage of a first string selection transistor connected to the first string selection line is higher than a first level and lower than a second level, applying a first voltage to the first string selection line; and when the first string selection line is unselected and the threshold voltage of the first string selection transistor is higher than the first level and lower than the second level, applying a second voltage less than the first voltage to the first string selection line.

17. The method of claim 16, further comprising: when when the first string selection line is unselected and the threshold voltage of the first string selection transistor is less than the first level, applying a third voltage less than the second voltage to the first string selection line.

18. The method of claim 16, further comprising:

when the first string selection line is selected and the threshold voltage of the first string selection transistor is higher than the second level, applying a third voltage higher than the first voltage to the first string selection line.

19. The method of claim 16, further comprising:

storing the detected threshold voltages in a status register.

20. The method of claim 16, wherein the string selection transistors are connected to a bit line, wherein the method further comprises:

selecting a voltage level supplied to the bit line according to the detected threshold voltages.

* * * * *